(12) United States Patent
Wang et al.

(10) Patent No.: US 10,732,743 B2
(45) Date of Patent: Aug. 4, 2020

(54) CONCEALABLE INPUT REGION FOR AN ELECTRONIC DEVICE HAVING MICROPERFORATIONS

(71) Applicant: Apple Inc., Cupertino, CA (US)

(72) Inventors: Paul X. Wang, Cupertino, CA (US); Alex J. Lehmann, Sunnyvale, CA (US); Qiliang Xu, Livermore, CA (US); Richard G. Huizar, Sunnyvale, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 15/965,838

(22) Filed: Apr. 27, 2018

(65) Prior Publication Data

US 2019/0025954 A1    Jan. 24, 2019

Related U.S. Application Data

(60) Provisional application No. 62/534,081, filed on Jul. 18, 2017.

(51) Int. Cl.
  *G06F 3/041* (2006.01)
  *G06F 3/01* (2006.01)
  (Continued)

(52) U.S. Cl.
  CPC .......... *G06F 3/041* (2013.01); *F21V 33/0052* (2013.01); *G06F 1/1692* (2013.01);
  (Continued)

(58) Field of Classification Search
  CPC . F21V 33/0052; F21Y 2115/10; G06F 1/1616
  See application file for complete search history.

(56) References Cited

U.S. PATENT DOCUMENTS

| 5,212,356 A | 5/1993 | English |
| 5,748,177 A | 5/1998 | Baker et al. |

(Continued)

FOREIGN PATENT DOCUMENTS

| CN | 1862732 | 11/2006 |
| CN | 101071354 | 11/2007 |

(Continued)

OTHER PUBLICATIONS

Rekimoto, Jun, "Thumbsense: Automatic Input Mode Sensing for Touch-Based Interactions," Interaction Laboratory, Sony Computer & Science Laboratories, Inc., 2 pages, Apr. 2003.

(Continued)

*Primary Examiner* — Chun-Nan Lin
(74) *Attorney, Agent, or Firm* — Dorsey & Whitney LLP

(57) ABSTRACT

Embodiments are directed to an electronic device having a hidden or concealable input region. In one aspect, an embodiment includes an enclosure having a wall that defines an input region having an array of microperforations. A light source may be positioned within a volume defined by the enclosure and configured to propagate light through the array of microperforations. A sensing element may be coupled with the wall and configured to detect input received within the input region. The array of microperforations are configured to be visually imperceptible when not illuminated by the light source. When illuminated by the light source, the array of microperforations may display a symbol.

17 Claims, 30 Drawing Sheets

(51) Int. Cl.
*G06F 3/0362* (2013.01)
*G06F 3/02* (2006.01)
*G06F 1/16* (2006.01)
*F21V 33/00* (2006.01)
*G09F 13/08* (2006.01)
*G09F 13/06* (2006.01)
*G09F 13/04* (2006.01)
*H01L 25/075* (2006.01)
*H01L 31/16* (2006.01)
*F21Y 115/10* (2016.01)

(52) U.S. Cl.
CPC ............ *G06F 3/016* (2013.01); *G06F 3/0202* (2013.01); *G06F 3/0362* (2013.01); *G09F 13/06* (2013.01); *G09F 13/08* (2013.01); *F21Y 2115/10* (2016.08); *G06F 1/1616* (2013.01); *G06F 1/1626* (2013.01); *G09F 2013/0463* (2013.01); *H01L 25/0753* (2013.01); *H01L 31/16* (2013.01)

(56) References Cited

U.S. PATENT DOCUMENTS

| | | | |
|---|---|---|---|
| 5,920,303 | A | 7/1999 | Baker et al. |
| 6,029,214 | A | 2/2000 | Dorfman et al. |
| 6,429,846 | B2 | 8/2002 | Rosenberg et al. |
| 6,822,640 | B2 | 11/2004 | Derocher |
| 7,236,154 | B1 * | 6/2007 | Kerr ................. G06F 1/1616 345/102 |
| 7,683,890 | B2 | 3/2010 | Geaghan |
| 7,847,789 | B2 | 12/2010 | Kolmykov-Zotov et al. |
| 8,063,893 | B2 | 11/2011 | Rosenberg et al. |
| 8,077,057 | B2 | 12/2011 | Ohshita et al. |
| 8,098,233 | B2 | 1/2012 | Hotelling et al. |
| 8,321,810 | B2 | 11/2012 | Heintze |
| 8,335,996 | B2 | 12/2012 | Davidson et al. |
| 8,378,975 | B2 | 2/2013 | Yoon et al. |
| 8,381,118 | B2 | 2/2013 | Minton |
| 8,390,481 | B2 | 3/2013 | Pance et al. |
| 8,432,362 | B2 | 4/2013 | Cheng et al. |
| 8,436,816 | B2 | 5/2013 | Leung et al. |
| 8,537,132 | B2 | 9/2013 | Ng et al. |
| 8,537,140 | B2 | 9/2013 | Tsai et al. |
| 8,570,280 | B2 | 10/2013 | Stewart et al. |
| 8,642,908 | B2 | 2/2014 | Moran et al. |
| 8,654,524 | B2 | 2/2014 | Pance et al. |
| 8,743,083 | B2 | 6/2014 | Zanone et al. |
| 8,766,922 | B2 | 7/2014 | Kim et al. |
| 8,786,568 | B2 | 7/2014 | Leung et al. |
| 8,804,347 | B2 | 8/2014 | Martisauskas |
| 8,854,325 | B2 | 10/2014 | Byrd et al. |
| 8,870,812 | B2 | 10/2014 | Alberti et al. |
| 8,952,899 | B2 | 2/2015 | Hotelling |
| 8,963,846 | B2 | 2/2015 | Lii et al. |
| 9,019,207 | B1 | 4/2015 | Hamburgen et al. |
| 9,098,120 | B2 | 8/2015 | Huh |
| 9,104,282 | B2 | 8/2015 | Ichikawa |
| 9,116,616 | B2 | 8/2015 | Kyprianou et al. |
| 9,122,330 | B2 | 9/2015 | Bau et al. |
| 9,195,354 | B2 | 9/2015 | Bulea et al. |
| 9,201,105 | B2 | 12/2015 | Iida et al. |
| 9,213,426 | B2 | 12/2015 | Clifton et al. |
| 9,250,738 | B2 | 2/2016 | Sharma |
| 9,367,146 | B2 | 6/2016 | Piot et al. |
| 9,367,158 | B2 | 6/2016 | Hotelling et al. |
| 9,400,579 | B2 | 7/2016 | Leung et al. |
| 9,542,097 | B2 | 1/2017 | Ganey et al. |
| 9,543,948 | B2 | 1/2017 | Curtis et al. |
| 9,635,267 | B2 | 4/2017 | Lee et al. |
| 9,753,569 | B2 | 9/2017 | Han et al. |
| 10,146,383 | B2 | 12/2018 | Leung et al. |
| 2004/0104894 | A1 | 6/2004 | Tsukada et al. |
| 2004/0257345 | A1 | 12/2004 | Makanae et al. |
| 2007/0076859 | A1 | 4/2007 | Tzvetanov |
| 2008/0039376 | A1 | 2/2008 | Peterson et al. |
| 2008/0272927 | A1 | 11/2008 | Woolley et al. |
| 2009/0225052 | A1 | 9/2009 | Liu |
| 2010/0265183 | A1 | 10/2010 | Mail et al. |
| 2010/0271315 | A1 | 10/2010 | Bathiche |
| 2010/0273530 | A1 * | 10/2010 | Jarvis ................. F16F 1/027 455/566 |
| 2010/0283741 | A1 | 11/2010 | Heintze et al. |
| 2011/0069021 | A1 | 3/2011 | Hill |
| 2011/0247158 | A1 * | 10/2011 | Jungnickel ............ G09F 13/06 15/167.1 |
| 2012/0001852 | A1 | 1/2012 | Ho et al. |
| 2012/0068933 | A1 | 3/2012 | Larsen |
| 2013/0002534 | A1 | 1/2013 | Braun et al. |
| 2014/0043289 | A1 | 2/2014 | Stern et al. |
| 2014/0317564 | A1 | 10/2014 | Odell et al. |
| 2014/0347312 | A1 | 11/2014 | Siska |
| 2014/0368455 | A1 | 12/2014 | Croisonnier et al. |
| 2015/0052473 | A1 | 2/2015 | Kuscher et al. |
| 2015/0123906 | A1 | 5/2015 | Mehandjiysky et al. |
| 2015/0153775 | A1 * | 6/2015 | Cheng ................. G06F 1/1637 428/137 |
| 2015/0153853 | A1 * | 6/2015 | Cheng ................. G06F 3/041 428/137 |
| 2015/0297145 | A1 | 10/2015 | Luna et al. |
| 2015/0309589 | A1 | 10/2015 | Chang |
| 2016/0098107 | A1 | 4/2016 | Morrell et al. |
| 2016/0103496 | A1 | 4/2016 | Degner et al. |
| 2016/0147440 | A1 | 5/2016 | Leyon |
| 2017/0090594 | A1 | 3/2017 | Silvanto et al. |
| 2017/0090596 | A1 | 3/2017 | Silvanto et al. |
| 2017/0090597 | A1 | 3/2017 | Silvanto et al. |
| 2017/0090654 | A1 | 3/2017 | Silvanto et al. |
| 2017/0315622 | A1 | 11/2017 | Morrell et al. |
| 2018/0011548 | A1 | 1/2018 | Garelli |
| 2018/0149321 | A1 * | 5/2018 | Torvinen ................. F21K 9/61 |
| 2019/0079610 | A1 | 3/2019 | Leung et al. |

FOREIGN PATENT DOCUMENTS

| | | |
|---|---|---|
| CN | 101482785 | 7/2009 |
| CN | 101609383 | 12/2009 |
| CN | 101644979 | 2/2010 |
| CN | 201563116 | 8/2010 |
| CN | 102171632 | 8/2011 |
| CN | 102200861 | 9/2011 |
| CN | 102844729 | 12/2012 |
| CN | 103164102 | 6/2013 |
| CN | 103176691 | 6/2013 |
| CN | 203260010 | 10/2013 |
| CN | 103384871 | 11/2013 |
| CN | 103455205 | 12/2013 |
| CN | 103577008 | 2/2014 |
| CN | 104423740 | 3/2015 |
| CN | 104834419 | 8/2015 |
| CN | 104915002 | 9/2015 |
| EP | 0189590 | 6/1986 |
| EP | 2305506 | 4/2011 |
| EP | 2664980 | 11/2013 |
| FR | 2980004 | 3/2013 |
| JP | 2001175415 | 6/2001 |
| TW | 200912612 | 3/2009 |
| TW | 201419112 | 5/2014 |
| WO | WO2007/032949 | 3/2007 |
| WO | WO2011/159519 | 12/2011 |
| WO | WO2014/124173 | 8/2014 |
| WO | WO2014/164628 | 10/2014 |

OTHER PUBLICATIONS

U.S. Appl. No. 15/258,173, filed Sep. 7, 2016, pending.
U.S. Appl. No. 15/400,416, filed Jan. 6, 2017, pending.
U.S. Appl. No. 15/965,840, filed Apr. 27, 2018, pending.

* cited by examiner

CONCEALABLE INPUT REGION FOR AN ELECTRONIC DEVICE HAVING MICROPERFORATIONS

CROSS-REFERENCE TO RELATED APPLICATION(S)

This application is a nonprovisional patent application of and claims the benefit of U.S. Provisional Patent Application No. 62/534,081, filed Jul. 18, 2017 and titled "Concealable Input Region for an Electronic Device," the disclosure of which is hereby incorporated herein by reference in its entirety.

FIELD

The described embodiments relate generally to input regions of an electronic device. More particularly, the present embodiments relate to structures that conceal or obscure the presence of an input region.

BACKGROUND

In computing systems, an input device may be employed to receive input from a user. Some traditional input devices include large buttons, keys, or other mechanically-actuated structures. However, these types of input devices may lack flexibility or adaptability and may permanently indicate the presence of the input device within the computing system.

SUMMARY

Embodiments of the present invention are directed to an electronic device having a hidden or concealed input region.

In a first aspect, the present disclosure includes an electronic device. The electronic device includes an enclosure defining an inner volume and having a wall defining an input region having an array of microperforations. The electronic device further includes a light source positioned within the inner volume and configured to propagate light through the array of microperforations. The electronic device further includes a sensing element positioned within the inner volume and configured to detect input received along the input region. The array of microperforations are configured to be visually imperceptible when not illuminated by the light source. The array of microperforations are further configured to display a symbol when illuminated by the light source.

A number of feature refinements and additional features are applicable in the first aspect and contemplated in light of the present disclosure. These feature refinements and additional features may be used individually or in any combination. As such, each of the following features that will be discussed may be, but are not required to be, used with any other feature combination of the first aspect.

For example, in an embodiment, the enclosure may define a watch body having a first opening and a second opening. The electronic device may further include a display positioned within the first opening. The electronic device may further include a crown at least partially positioned within the second opening. A graphical output of the display may be responsive to: (i) a rotation or translation of the crown; and (ii) input received along the input region.

In another embodiment, the wall may define a top surface having a first opening and a second opening. The input region may be defined along the top surface. The electronic device may further include a display positioned within the first opening. The electronic device may further include a button positioned within the second opening. A graphical output of the display may be responsive to: (i) a mechanical press of the button; and (ii) input received within the input region.

In other embodiments, the enclosure includes an upper portion pivotally coupled with a lower portion The upper portion may define an opening and the lower portion may include the input region. The electronic device may further include a display positioned within the opening. The display may be responsive to the input received within the input region. Additionally or alternatively, the lower portion may define an array of key openings. As such, the electronic device may further include an array of key caps positioned along corresponding key openings of the array. The display may be responsive to a mechanical press at one or more of the key caps.

According to another embodiment, the wall includes a metal layer. As such, the array of microperforations may extend through the metal layer. In another case, the wall includes a translucent layer and the electronic device further includes an opaque masking layer positioned within the volume defined by the enclosure. As such, the array of microperforations may extend through the opaque masking layer.

In another embodiment, the sensing element includes one or more of: (i) a tactile dome switch; (ii) an electroactive polymer; (iii) a piezoelectric structure; (iv) a magnetic-based sensor; (v) a capacitance-based sensor; or (vi) an optical sensor.

In this regard, a second aspect of the present disclosure includes an electronic device. The electronic device includes a translucent layer defining an input region and configured to deform in response to a force input. The electronic device further includes an opaque masking layer positioned below the translucent layer and having an array of microperforations. The electronic device further includes a light source positioned below the translucent layer and configured to illuminate a symbol on the input region by illuminating the array of microperforations. The electronic device further includes a sensing element positioned below the translucent layer and configured to detect the force input at the input region. The array of microperforations are not visually perceptible when not illuminated by the light source.

A number of feature refinements and additional features are applicable in the second aspect and contemplated in light of the present disclosure. These feature refinements and additional features may be used individually or in any combination. As such, each of the following features that will be discussed may be, but are not required to be, used with any other feature combination of the second aspect.

For example, in an embodiment, the translucent layer may form an exterior surface of an enclosure and the enclosure may define an internal volume of the electronic device. The opaque masking layer may conceal the internal volume of the enclosure. The array of microperforations may allow light emitted by the light source to propagate through the opaque masking layer. To facilitate the foregoing, a width of a given microperforation may be within a range of 30 microns to 80 microns. Further, a separation between one or more microperforations may be within a range of 80 microns to 500 microns.

According to another embodiment, one or more of the array of microperforations may be defined by a non-linear edge of the opaque masking layer. In some cases, at least a subset of the array of microperforations may be defined by tapered sidewalls extending through a thickness of the opaque masking layer. The array of microperforations may be arranged on the opaque masking layer to collectively define at least one of an alpha-numeric character or a boundary of the input region. The array of microperforations may be operative to control an optical characteristic of light propagated through the opaque masking layer, and thereby define a viewing angle of the symbol relative to the translucent layer.

In other embodiments, the symbol is a first symbol and the light source includes an array of selectively operable light elements configured to illuminate: (i) the first symbol using a first subset of the array of microperforations; and (ii) a second symbol using a second subset of the array of microperforations. At least one microperforation of the array of microperforations may belong to both the first and second subsets. The sensing element may be operative to: (i) when the first symbol is illuminated, trigger a first switch event in response to the detected force input; and (ii) when the second symbol is illuminated, trigger a second switch event in response to the detected force input.

In this regard, a third aspect of the present disclosure includes an electronic device. The electronic device includes a translucent layer forming an external surface of an electronic device. The electronic device further includes a sensing element positioned within the electronic device and configured to detect input along an input region defined along the external surface. The electronic device further includes an opaque masking layer positioned below the translucent layer and defining an array of microperforations. The electronic device further includes a light source having an array of selectively operable light elements configured to illuminate the array of microperforations. The array of microperforations are visually imperceptible when not illuminated. In a first mode, the light source may be configured to reveal a first illuminated symbol formed by the array of microperforations. In a second mode, the light source may be configured to reveal a second illuminated symbol formed by the array of microperforations.

A number of feature refinements and additional features are applicable in the third aspect and contemplated in light of the present disclosure. These feature refinements and additional features may be used individually or in any combination. As such, each of the following features that will be discussed may be, but are not required to be, used with any other feature combination of the third aspect.

For example, in an embodiment, the first illuminated symbol may correspond to a first subset of the array of microperforations. Further, the second illuminated symbol may correspond to a second subset of the array of microperforations. The electronic device may further include a display. A graphical output of the display may be modified: (i) in a first manner in response to an input within the input region when the first symbol is illuminated; and (ii) in a second manner in response to an input within the input region when the second symbol is illuminated.

According to another embodiment, the first illuminated symbol may correspond to a boundary of the input region. Further, the second illuminated symbol may correspond to a modified boundary of the input region. The sensing element is responsive to: (i) input received within the boundary when the first illuminated symbol is displayed at the translucent layer; and (ii) input received within the modified boundary when the second illuminated symbol is displayed at the translucent layer.

In another embodiment, the sensing element may be responsive to a deflection of the translucent layer caused by the input. The sensing element may at least partially include a haptic structure configured to produce a predetermined tactile output within the input region in response to the detected input. The light source may include an array of LEDs positioned below selective microperforations of the array.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like elements.

Figure 1A:
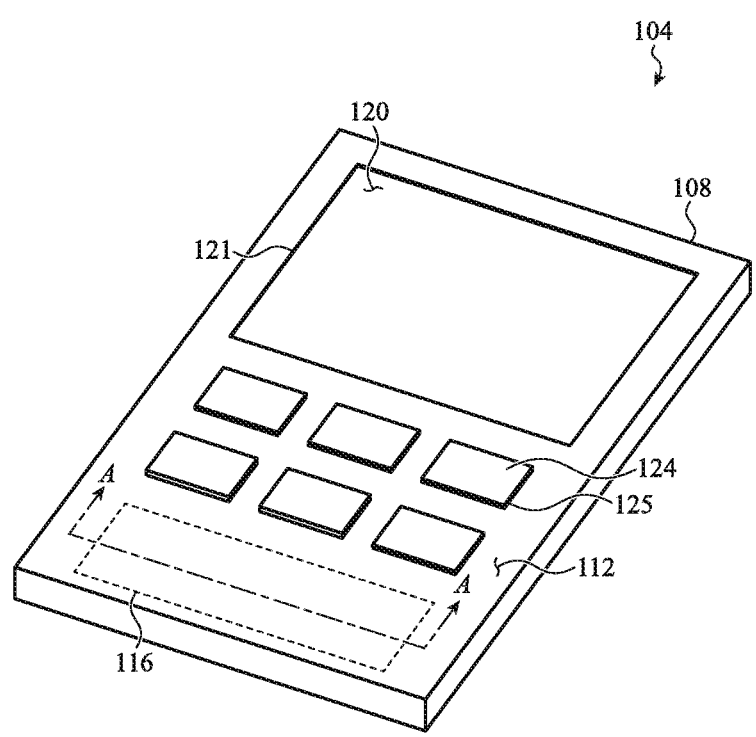
FIG. 1A depicts a sample electronic device including an input region.

The use of cross-hatching and/or shading in the accompanying figures is generally provided to clarify the boundaries between adjacent elements and also to facilitate legibility of the figures. Accordingly, neither the presence nor the absence of cross-hatching and/or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

The description that follows includes sample systems, methods, and apparatuses that embody various elements of the present disclosure. However, it should be understood that the described disclosure may be practiced in a variety of forms in addition to those described herein.

The present disclosure describes systems, devices, and techniques related to an electronic device having a hidden or concealable input region. The electronic device may include an enclosure wall or other enclosure component that forms an external surface of the electronic device. An input region may be defined along the external surface, which may be configured to control a function of the electronic device in response to an input, including a force input, touch input, and/or proximity input. An array of microperforations may be arranged over a portion of the input region. When illuminated or in an activated state, the microperforations may display virtual keys, buttons, notification graphics, or other indicia or symbols at the external surface, and thereby reveal the input region. When not illuminated or in a deactivated state, the array of microperforations may not be visually perceptible or visible. In some cases, the external surface may be substantially free of visual indications of the input region and the input functionality of the input region may be concealed.

As used herein, the term microperforation may be used to refer to a small opening that, when arranged in an array or pattern of similar openings may be visually imperceptible when not illuminated and display a symbol or graphic when illuminated. For example, a microperforation may have a width of about 30-80 microns, and therefore is visually imperceptible or concealed from the user when not illuminated. In some cases, although the symbol or graphic is formed from an array of individual microperforations, the symbol or graphic may appear solid or uniform and the individual microperforations may not be distinguishable when viewed with the naked eye (at an appropriate viewing distance).

As described herein, the enclosure wall may include and/or be formed from a translucent (e.g., light transmissible) layer and/or a metal layer. For example, in an embodiment, the enclosure wall may include a translucent layer, which may be a component of, or may form, an electronic device enclosure, and which defines the external surface having the input region. The translucent layer may be formed from one or more translucent materials including, for example, glass, ceramic, plastic, or a combination thereof. As used herein, the term translucent or translucent layer may be used to refer to a material or layer that allows the passage of light and does not require that the material or layer be transparent, clear, or otherwise free from features that scatter or absorb some amount of light. As used herein, the term translucent may generally refer to a material or layer that is optically transparent, partially, transparent, or otherwise able to transmit light. As such, the translucent layer may be, or form a component of, a top case of a laptop that may be metal, plastic, glass, carbon fiber, ceramic, or other materials, as described herein. For example, the translucent layer may extend through a thickness of the enclosure such that the internal surface is positioned within an internal volume defined by the enclosure. This may allow light to propagate through the translucent layer between an interior and exterior of the electronic device. The translucent layer may also be configured to deform in response to an input (e.g., a localized section may translate inward in response to a force; this may be tactilely imperceptible). This may allow the input assembly or other component to detect a force input received at the input region by measuring the bending or deflection of the translucent layer.

The opaque masking layer may be positioned along the internal surface of the translucent layer and control the propagation of light through the translucent layer. The opaque masking layer may be an ink, coating, substrate, deposition, or other structure that impedes or blocks light. As such, the array of microperforations, defined by the opaque masking layer, may form a channel or passage through the opaque masking layer that allows light to pass through the opaque masking layer and propagate toward the input region defined on the translucent layer. When illuminated, the array of microperforations may define a virtual key within the input region by propagating light through the translucent layer in a manner that resembles the virtual key. When not illuminated by the light source, the array of microperforations may be visually imperceptible or invisible to the unaided human eye, due in part to a width, diameter, or other dimension of a given microperforation being about 30-80 microns. For example, the width may be a maximum dimension of the microperforation as measured across an exterior surface of the device. This may allow the opaque masking layer to conceal or hide the input assembly positioned within the enclosure, and thus allow the translucent layer to resemble a device enclosure free from markings, symbols, and/or other indication of an input region.

The array of microperforations may be arranged across the opaque masking layer in a variety of manners. The array of microperforations may be holes, openings, through portions, and/or other circular or curved features in the opaque masking layer that allow light to pass through. However, the array of microperforations may also resemble various other shapes, including shapes with linear edges, shapes with non-linear edges, angular shapes, and/or irregular or unsymmetrical shapes. The array of microperforations may be arranged to collectively define a virtual key or symbol such that illumination (from within the enclosure) causes the virtual key or symbol to appear within the input region. In other embodiments, the array of microperforations may be arranged in a matrix (e.g., a dot matrix configuration) and selective subsets of the array of microperforations may be illuminated to define various different virtual keys or symbols within the input region. The array of microperforations may also be selectively illuminated to display a dimensionally-variable boundary of the input region at the translucent layer.

Optical characteristics of an illuminated virtual key or symbol may be tuned or controlled using the array of microperforations. This may include controlling or tuning a spacing, dimension, shape, and/or other feature of the array of microperforations to produce a desired visual effect. For example, and as described in greater detail below, the sharpness, contrast, brightness, color, optimal viewing angle, and/or other optical characteristics may be at least partially dependent on the shape, dimension, spacing, angle, or other physical attribute of the array of microperforations.

It will be appreciated that the array of microperforations may be defined by other components and structures of the electronic device, as described herein. For example, the array of microperforations may be defined by a wall of the enclosure that forms an external surface of the electronic device. The wall may be formed from a metal material, such as aluminum, that blocks or inhibits the passage of light. Similar to the array of microperforations defined by the opaque masking layer, the array of microperforations defined by the enclosure wall may be visually imperceptible when not illuminated and display a symbol or glyph within the input region when illuminated from within the electronic device.

The input assembly includes a light source positioned below the array of microperforations. The light source may include a light emitting diode (LED), micro-LED, light guide, liquid crystal display (LCD), organic light emitting diode (OLED), fluorescent light, and/or other light emitting elements that propagate light from through the opaque masking layer and toward the input region. The light source may be operative to illuminate some or all of the microperforations to illuminate various different virtual keys or symbols of the translucent layer, as described in greater detail below.

An illuminated virtual key may reveal the input region and a symbol that may indicate a function of the electronic device. The translucent layer may be configured to receive an input within the input region when illuminated that may be used to control the electronic device. A sensing element, or other component of the input assembly, may be positioned within the device enclosure and configured to detect a touch and/or force input received within the input region at the translucent layer. The sensing element may be a non-contact-based sensor that measures various electrical parameters to detect a touch and/or force input, including optical, magnetic, and capacitance-based sensors, among other non-contact-based sensors. In other cases, the sensing element may be a contact-based sensor, including a tactile dome switch, strain gauge, piezoelectric or electroactive polymer (EAP) stack, or the like, among other contact-based sensors. The sensing element may include multiple combinations of sensors, including contact-based and non-contact-based sensors, that cooperate to measure the force and/or touch input received at the translucent external surface. In some cases, the sensing element may measure localized or generalized deflection or bending of the translucent layer inward and trigger a corresponding switch event. The sensing element may also be configured to produce various haptic effects, as described herein, and/or be coupled with a separate haptic structure that produces a haptic or tactile output along the input region.

A haptic structure may generally be configured to simulate the tactile experience of a mechanical or physical key and/or produce a tactile confirmation of an input, among other effects. In one configuration, the haptic structure may be a collapsible dome, spring, biasing element, and/or other mechanically actuated assembly that is responsive to an input. For example, a collapsible dome or spring may be coupled with the translucent layer and buckle and/or deform in response to the force input, thereby producing a desired haptic effect. In another configuration, the haptic structure may be an electromagnet, EAP, piezoelectric stack, voice-coil actuator, and/or other electrically actuated assembly that is coupled with the translucent layer and configured to produce a predetermined tactile output or effect at the input region. In some cases, the haptic structure may be a component of the sensing element and/or input assembly, for example, as may be the case when the haptic structure is a collapsible dome that is a component of a tactile dome switch. Further, as described herein, multiple combinations of haptic structures may cooperate to deliver a desired haptic effect, including various combinations of mechanically and electrically actuated haptic structures, as may be appropriate for a given application.

The input region may be dynamically adaptable to control multiple functions of the electronic device. Multiple different or distinct virtual keys or symbols may be displayed within the input region to indicate or reveal the presence of multiple functions. For example, the input assembly may illuminate a first subset of the array of microperforations to display a first symbol within the input region and subsequently illuminate a second subset of the array of microperforations to display a second symbol within the input region. For example, the light source of the input assembly may selectively illuminate the first and second subsets of the array of microperforations in response to a processing unit of the electronic device associating the input region with a particular function. The first and second symbols, for example, may be indicative of the function associated with the input region. Additionally or alternatively, the first and second symbols may be indicative of a dimensionally variable boundary of the input region, for example, such as a first boundary and a modified boundary. In this regard, the input assembly may be configured to trigger a switch event corresponding to the specified function in response to detecting a force and/or touch input within the input region. In this regard, the input assembly may be responsive to input received within the first boundary when the first symbol is illuminated and responsive to input received within the modified boundary when the second symbol is illuminated. Haptic effects and optical characteristics of the illuminated symbol may also be adaptable based on a given function of the input region.

The input region may be dynamically adaptable based on a user's interaction with an illuminated virtual key or symbol at the input region. For example, the illuminated key may resemble a knob, slider switch, or other control that accepts a continuous range of inputs. The input assembly may detect an input corresponding to a manipulation of the knob or slider and dynamically adapt the illuminated symbol according to the detect manipulation (e.g., such as repositioning the knob or slider into the manipulated position). This may allow the input region to simulate physical controls that accept a variable or range of inputs, such as volume controls, scrolling wheels, audio mixing bars, photographic editing tools, or the like.

In some embodiments, an array of microperforations are used to illuminate a region that is not an input region. For example, and as described in more detail herein, the array of microperforations may be used to display a symbol or graphic along a portion of an exterior surface of a device that is not configured to receive touch or force input. Such a region may be used to communicate a status, mode, or other aspect of the operation of the electronic device.

It will be appreciated that the input region described herein may be implemented with respect to a variety of electronic devices. The electronic devices, as described herein, may be substantially any electronic device having, or coupled with, a translucent layer and configured to receive an input, including notebook computers, desktop computers, smart phones, tablets, portable media players, watches, pencils, and/or other appropriate electronic devices, including wearable devices. In some cases, the electronic device may be defined by an enclosure (at least a portion of which is translucent) having one or more openings that surround or contain a display and/or a button. In other embodiments, the electronic device may be a component or segment of a substantially mechanical structure, such as a wall of a building, a panel, dashboard, door, doorframe, or the like. For example, a wall of a building may be used to define the input region and control various functions of the building, such as climate controls, lighting, and so on. As such, the discussion of any electronic device is meant as illustrative only.

Reference will now be made to the accompanying drawings, which assist in illustrating various features of the present disclosure. The following description is presented for purposes of illustration and description. Furthermore, the description is not intended to limit the inventive aspects to the forms disclosed herein. Consequently, variations and modifications commensurate with the following teachings, and skill and knowledge of the relevant art, are within the scope of the present inventive aspects.

FIG. 1A depicts an electronic device 104, such as the electronic device generally discussed above and described in more detail below. The electronic device 104 may include a translucent layer that forms an external surface of an enclosure of the electronic device 104. A concealable input region may be defined along the external surface of the enclosure and used to control a function of the electronic device 104.

In a non-limiting example, as shown in FIG. 1A, the electronic device 104 includes an enclosure 108. The enclosure 108 may form an exterior surface of the electronic device 104 and define an internal volume. For example, the enclosure 108 may define sidewalls, and top and bottom surfaces of the electronic device 104 that enclose or encompass internal components of the electronic device 104, including various electrical and structural components described herein.

The enclosure 108 may have, or be partially formed from, a translucent layer. For example, as shown in FIG. 1A, a surface of the enclosure 108 may be defined or formed from an enclosure wall 112. In an embodiment, the enclosure wall 112 may be a light transmissible layer that allows light to propagate between an exterior and an interior of the electronic device 104 substantially unobstructed. For example, the enclosure wall 112 may be formed from a ceramic (e.g., sapphire, corundum), glass, plastic, synthetic, composite, or other appropriate translucent, transparent, partially transparent, or otherwise light-transmissible structure configured to form a surface of a device enclosure. In other embodiments, the enclosure wall 112 may be a metal component that substantially inhibits the passage of light (e.g., opaque wall 137 of FIG. 2C). For example, the enclosure wall 112 may be, or form a component of, a top case of a laptop that may be metal, plastic, glass, carbon fiber, ceramic, and/or other materials.

An exterior surface of the enclosure wall 112 may resemble an exterior surface of a device enclosure free of markings and/or having a substantially uniform appearance. Despite appearances, in an activated state, the electronic device 104 may define an input region 116 along the external surface of the enclosure wall 112. The input region 116 may be configured to receive an input, including a touch input, a force input, and/or a proximity input that is used to control a function of the electronic device 104.

As described in greater detail below, the input region 116 may be a concealable or hidden input region of the electronic device 104. For example, an opaque masking layer having an array of microperforations may be positioned along an underside surface of the enclosure wall 112. The opaque masking layer may generally conceal an interior of the enclosure 108 and the array of microperforations may be visually imperceptible or invisible when not illuminated. When activated, the electronic device 104 reveals the input region 116 by propagating light through the array of microperforations to display a symbol, glyph, marking, or other indicium corresponding to the input region 116. An input assembly, sensing element, or the like may be positioned below the input region 116 and configured to trigger a switch event in response to a touch or force input received within the input region 116.

The electronic device 104 may include various other input/output components that support one or more functions of the electronic device 104. For purposes of illustration, FIG. 1A depicts the electronic device 104 as including a display 120 and keys 124. The electronic device 104 may also include a processing unit (optionally including executable logic and/or sets of computer readable instructions) and/or other hardware or software for use in facilitating the operations described herein (e.g., processing unit 1408 of FIG. 14). It should be noted that the electronic device 104 may also include various other components, such as one or more ports (e.g., a charging port, a data transfer port, or the like), communications elements, additional input/output members (including additional buttons), and so on. As such, the discussion of any electronic device, such as electronic device 104, is meant as an illustrative only. In the embodiment of FIG. 1A, the display 120 may be positioned within a first opening 121 defined by the enclosure 108 and the keys 124 may be positioned within an array of key openings 125 defined by the enclosure 108.

The display 120 may depict a graphical output of the electronic device 104. A graphical output of the display 120 may be modified in a first manner in response to an input received within the input region 116 and in a second manner in response to a mechanical press received at one or more of the keys 124. For example, a graphical output of the display 120 may be modified to depict a letter or symbol illuminated within the input region. In some cases, the depicted letter or symbol on the display 120 may be modified in response to input at one or more of the keys 124. It will be appreciated that the electronic device 104 may be any suitable device having a concealable or hidden input region, as described herein, including data-entry devices, word-processing devices, desktop computers, notebook computers, smart phones, tablets, portable media players, or the like. Other examples of electronic devices may include health monitoring devices, digital cameras, printers, scanners, security systems or devices, or electronics for automobiles, buildings, or other structures, among other electronic devices.

The input region 116 may be a concealable or hidden input surface defined on the enclosure wall 112. The electronic device 104 may define an input region 116 on the enclosure wall 112 and activate a light source to illuminate a symbol indicative of the input functionality or notification associated with the input region 116. In this regard, FIGS. 1B-1D depict the enclosure wall 112 having the input region 116 in various states of illumination.

Figure 1B:
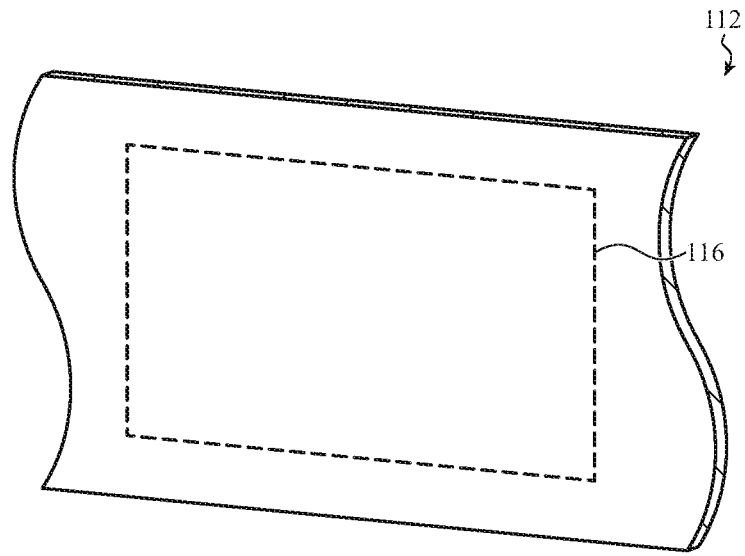
FIG. 1B depicts an enlarged view of the input region of FIG. 1A in an unilluminated configuration.

In particular, FIG. 1B depicts the enclosure wall 112 having the input region 116 in an unilluminated state. In the unilluminated state, the enclosure wall 112 may have a substantially uniform appearance that matches or blends with a surrounding portion or region of the electronic device 104. When in the unilluminated state, the electronic device 104 may be unresponsive to input received within the input region 116 (or other region of the enclosure wall 112), and thus the enclosure wall 112 may temporarily be an external surface of the enclosure 108 having no input functionality.

In an illuminated state, the electronic device 104 may reveal the input functionality of the input region 116 by causing various symbols, indicia, or the like to be illuminated or displayed within the input region 116. In this regard, FIG. 1C depicts the enclosure wall 112 having the input region 116 in the illuminated state. As shown in FIG. 1C, the electronic device 104 may display or illuminate a symbol 128 within the input region 116. When in the illuminated state, the electronic device 104 may be responsive to input received within the input region 116, and thus the input region 116 may be used to control a function of the electronic device 104. In other cases, the symbol 128 may be used to indicate a status or notification of the electronic device 104 and not necessarily be used to control a function of the electronic device 104. In the instant embodiment, the symbol 128 may depict information relating to an "email" notification or command. For example, the electronic device 104 may illuminate the symbol 128 within the input region 116 when the electronic device 104 detects an incoming or pending email message; the input region 116 may subsequently receive input that causes the electronic device 104 to access the email message. It will be appreciated, however, that the email related information depicted by the symbol 128 (and corresponding function) is shown for purposes of illustration. As described herein, the symbol 128 may depict any appropriate information, including dynamically adaptable information, as may be appropriate for a given application.

Figure 1C:
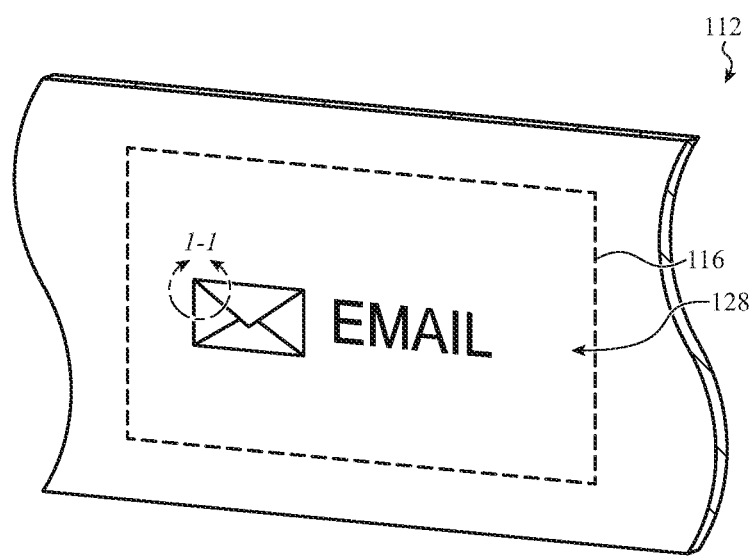
FIG. 1C depicts an enlarged view of the input region of FIG. 1A in an illuminated configuration.
Figure 1D:
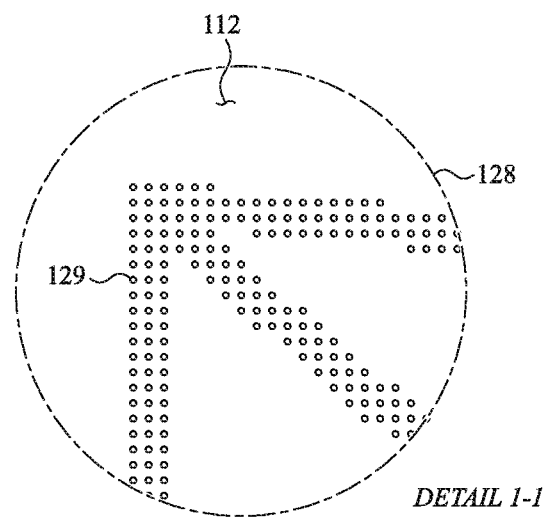
FIG. 1D depicts detail 1-1 of the symbol of FIG. 1C.

FIG. 1D depicts detail 1-1 of FIG. 1C of the symbol 128. As shown in the non-limiting example of FIG. 1D, the symbol 128 may be defined by an illuminated pattern of smaller shapes, patterns, features, or the like that collectively define the symbol 128. For example, the envelope of the symbol 128 may be defined by an illuminated pattern 129 that collectively defines the symbol 128.

As described in greater detail below, the illuminated pattern or shapes or features that define the symbol 128 may be formed based on an opaque masking layer positioned on an underside of the enclosure wall 112. In particular, the opaque masking layer may define a series of microperforations, or visually imperceptible holes (when unilluminated), that allow light to pass through the opaque masking layer. As such, in an illuminated condition, the electronic device 104 may actuate a light source disposed within the enclosure 108 and propagate light through the array of microperforations. This may cause the symbol 128 to appear within the input region.

In this regard, the illuminated pattern 129 depicted in FIG. 1D may correspond to an array of microperforations formed within an opaque masking layer. For example, each circle or other feature of the illuminated pattern may correspond to a portion of the opaque masking layer at which light is allowed to propagate through the opaque masking layer and toward an exterior surface of the enclosure wall 112. The array of microperforations may thus be arranged across the opaque masking layer to form the illuminated pattern 129 of the symbol 128. In other cases, the array of microperforations may be arranged in a grid, matrix, or other configuration, and the electronic device 104 may selectively illuminate various subsets of the array of microperforations to form the illuminated pattern 129 of the symbol 128 within the input region 116.

It will be appreciated that the illuminated pattern 129 is visible in FIG. 1D for purposes of showing an enlarged view of the symbol 128. Accordingly, given the relative size of the microperforations, the symbol 128 may appear to be formed from continuous or unbroken lines when viewed at an appropriate distance. For example, rather than perceive the individual microperforations that define the symbol 128, a user may perceive the symbol 128 as a substantially solid symbol or a symbol having a collection of solid lines. The symbol 128 may appear to be solid when viewed at a distance because the microperforations have a size and/or a shape that causes light emitted through the individual microperforations to blend or mix with surrounding ones of the microperforations. This effect of the microperforations (to form a solid or continuous symbol from discrete openings when illuminated from within the electronic device 104) may be especially observable when a user views the input region 116 at a distance of several inches to several feet, which may correspond to an appropriate viewing distance for viewing and/or interacting with the electronic device 104.

Figure 2A:
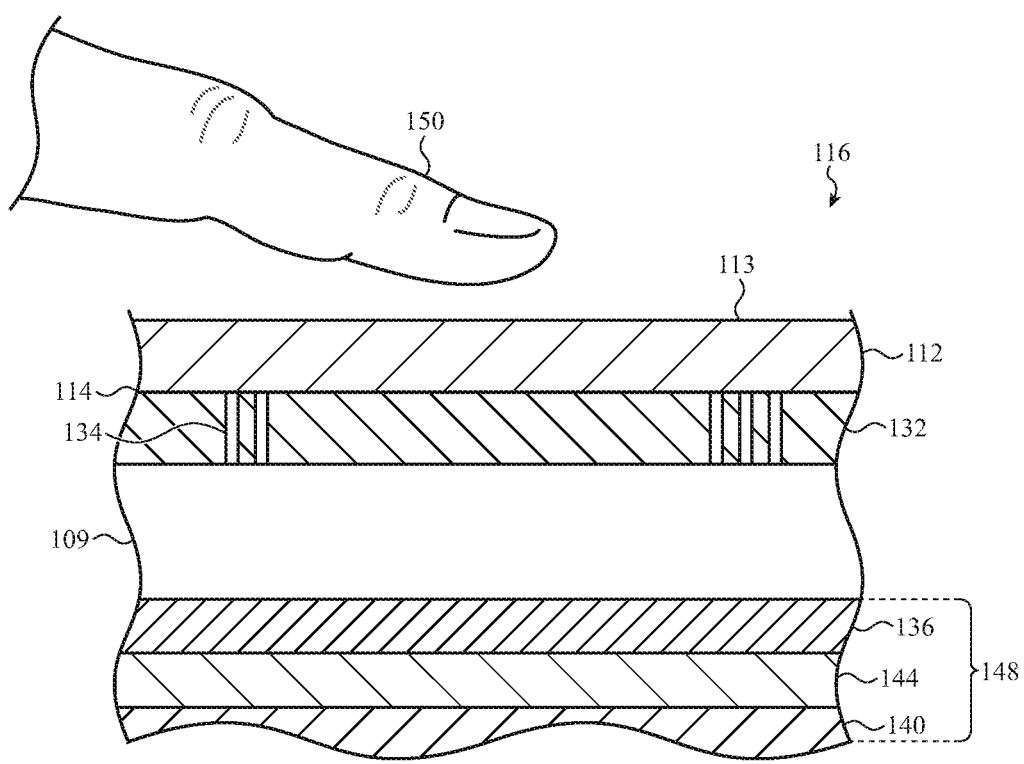
FIG. 2A depicts a cross-sectional view of the input region of FIG. 1A in an unactuated position, taken along line A-A of FIG. 1A.

FIG. 2A depicts a functional cross-sectional view of the input region 116 of FIG. 1A. The input region 116 is shown in FIG. 2A in an unactuated configuration, for example, in which the input region 116 is not receiving an input.

Broadly, the input region 116 includes various components that allow the electronic device 104 to conceal or hide the input region 116 on the enclosure 108 and use the input region 116 to display an illuminated symbol and control a function of the electronic device 104. As shown in FIG. 2A, the input region 116 may be associated with a cross-section or region of the electronic device 104 that includes the enclosure wall 112, an opaque masking layer 132, a light source 136, a haptic structure 140, and a sensing element 144. The opaque masking layer 132 may define an array of microperforations 134 that extend through the opaque masking layer 132 and define or form a symbol, glyph, or other indicia. The light source 136, the haptic structure 140, and sensing element 144 may collectively form an input assembly 148 that may be used to define an illuminated symbol on the enclosure wall 112 using the array of microperforations 134 to detect input with the input region 116. The input assembly 148 may be positioned within an interior volume 109 of the enclosure 108.

The enclosure wall 112 may define an external surface 113 of the electronic device 104. The enclosure wall 112 may extend into and through a thickness of the enclosure 108 and have an underside surface 114 positioned within the enclosure 108, for example, such as within the interior volume 109. This may allow light to pass substantially unobstructed through the enclosure 108 between an exterior and interior of the electronic device 104. The enclosure wall 112 may be configured to receive an input, including a touch or proximity-based input and/or a force input. As such, the enclosure wall 112 may exhibit one or more material characteristics that allow the enclosure wall 112 to bend, deflect, deform, or the like in response to a force input received within the input region 116. The enclosure wall 112 may be a multi-layered structure that may include one or both of a translucent layer and/or a metal layer. The enclosure wall 112 may also define various textured surfaces, which may be positioned along an exterior of the electronic device and have various light dispersive properties. For example, when the enclosure 112 is a translucent layer, the enclosure wall 112 may have a textured surface at or near the input region 116 that directs light emitted from within the electronic device 104 in a particular direction. The input assembly 148, as described below, may use such material characteristics of the enclosure wall 112 to detect force input received within the input region 116.

The opaque masking layer 132 may be positioned along the underside surface 114 of the enclosure wall 112. In some cases, the opaque masking layer 132 may be formed directly on the underside surface 114, for example, through a printing, deposition, sputtering, platting, or other appropriate process. In other cases, the opaque masking layer 132 may be a separate substrate, film, or other layer applied to the underside surface 114 or on an intermediate PET layer connected to the underside surface 114 (e.g., as described in greater detail below with respect to FIG. 2D). The opaque masking layer 132 may be an ink, coating, resin, or other structure that substantially blocks the passage of light therethrough. The opaque masking layer 132 may be pliable or malleable enough to bend repeatedly without cracking, breaking, or otherwise being damaged. As such, when applied to the underside surface 114, the opaque masking layer 132 may prevent light from traveling between the exterior and interior of the electronic device 104.

Despite the opaque masking layer 132 substantially blocking the passage of light, the array of microperforations 134 defined within the opaque masking layer 132 may allow light to travel through the opaque masking layer 132. The array of microperforations 134 may be openings, holes, through portions, cuts, grooves, recesses, or other features that extend through a completed thickness of the opaque masking layer 132. In this regard, the array of microperforations 134 may allow light to travel through the opaque masking layer 132 and subsequently through the enclosure wall 112. As described herein, the array of microperforations 134 may define, or may be used to define, a symbol on the external surface 113. For example, the electronic device 104 may illuminate the interior volume 109 using the light source 136 and thus cause the enclosure wall 112 to display a symbol within the input region 116 corresponding to the illuminated array of microperforations 134.

At the external surface 113, the array of microperforations 134 may be substantially visually imperceptible when not illuminated. For example, the array of microperforations 134 may have a size, shape, or other characteristic that renders the array of microperforations 134 invisible or not visually perceptible to the unaided human eye. This may allow the array of microperforations 134 to be concealed from a user by a translucent layer, enclosure wall, and so forth when not illuminated. In one embodiment, the array of microperforations 134 may have a width or other cross-dimension within a range of 30 microns to 80 microns. For example, the array of microperforations 134 may be defined by a pattern of circles that each have a diameter within a range of 30 micron to 80 microns. The array of microperforations 134 may be arranged across the opaque masking layer 132 so that each perforation is separated by a distance within a range of 80 microns to 500 microns. For example, where each microperforation is defined by a circle, each circle may be separated across the opaque masking layer 132 by a distance within a range of 80 microns to 500 microns. It will be appreciated that other dimensions and geometries are contemplated and described in greater detail below, including configurations in which a width of each microperforation is less than 30 microns or greater than 80 microns, including a width of 130 microns or greater, and where the separation distance is less than 80 microns or greater than 500 microns. Further, each microperforation of the array of microperforations 134 need not have identical or uniform widths or separations; in some cases, various subsets of the array of microperforations 134 may have distinct widths or separations, which may be used to produce a desired optical effect, among other considerations.

Positioned below the opaque masking layer 132 is the input assembly 148. As described above, the input assembly 148 includes the light source 136, the haptic structure 140, and the sensing element 144. The light source 136, the haptic structure 140, and the sensing element 144 may be arranged in any appropriate configuration within the interior volume 109 to illuminate a symbol on the external surface 113 of the enclosure wall 112, detect an input within the input region 116, and produce a corresponding haptic or tactile output. This may allow the input assembly 148 to control one or more functions of the electronic device 104. In some cases, the input assembly 148 may include fewer or more components as may be necessary for a given application. For example, the input assembly 148 may include the light source 136 in configurations where the input region 116 is used to provide notifications free of input and/or haptic functionality.

The light source 136, as described in greater detail below with respect to FIGS. 7A-7C, may be any appropriate component that emits light. In particular, the light source 136 may be any appropriate component that propagates light through the array of microperforations 134 and toward the external surface 113. Sample light sources, as described herein, including LEDs, micro-LEDs, and/or light guides, however, other light sources 136 may also be used.

The haptic structure 140, as described in greater detail below with respect to FIGS. 9A-9J, may be any appropriate structural component that produces a haptic or tactile output. In particular, the haptic structure 140 may be any appropriate component that delivers a movement or vibration along the external surface 113 that is perceptible to human touch. The electronic device 104 may use the haptic structure 140 to deliver the haptic or tactile output in response to an input received within the input region 116. For example, the haptic structure 140 may be a mechanical structure, such as a collapsible dome, spring, or the like that produces movement or vibration in response to a force input received within the input region 116. In other cases, the haptic structure 140 may be an electrically actuated assembly that delivers a haptic or tactile output in response to a detection of a touch and/or force input by the sensing element 144. For example, the haptic structure 140 may be an electromagnet, electroactive polymer or piezoelectric (EAP) stack, or the like. In an embodiment, the haptic structure 140 may be at least partially included within, or directly coupled to, the sensing element 144, for example, which may be the case where the haptic structure 140 is a collapsible dome of a tactile dome switch used to detect a force input received within the input region 116.

The sensing element 144, as described in greater detail below with respect to FIGS. 9A-9J, may be any appropriate component that detects a touch and/or force input received within the input region 116. In this regard, the sensing element 144 may be a wide variety of components, sensors, assemblies, or the like that are positioned below and/or coupled with the enclosure wall 112. In one embodiment, the sensing element 144 may be a non-contact-based sensing element that detects a touch and/or force input. This may include a capacitive or magnetic-based sensor that is configured to detect a proximity of a user 150 to the enclosure wall 112, including a contact between the user 150 and the external surface 113. The non-contact-based sensing element may also detect localized or generalized bending or deflection of the enclosure wall 112 which may be used to determine a corresponding force input associated with the deflection. Additionally or alternatively, the sensing element 144 may be a contact-based sensor, such as a tactile dome switch, that detects a force input on the external surface 113 in response to localized or generalized bending or deflection of the enclosure wall 112.

It will be appreciated that the functional cross-sectional view of the input assembly 148 is presented in FIG. 2A for purposes of illustration only. In various embodiments described herein, the input assembly 148 may include multiple, distinct sensing elements and/or haptic structures that may be coupled to one another to produce a desired effect. For example, the sensing element 144 and the haptic structure 140 may each include multiple, distinct structures, such as one or more of the distinct sensing and/or haptic structures described with respect to FIGS. 9A-9J. As such, the sensing elements and/or haptic structures described with respect to FIGS. 9A-9J may be used or grouped in any appropriate combination, including being used in isolation, to form the input assembly 148 described with respect to FIG. 2A.

Figure 2B:
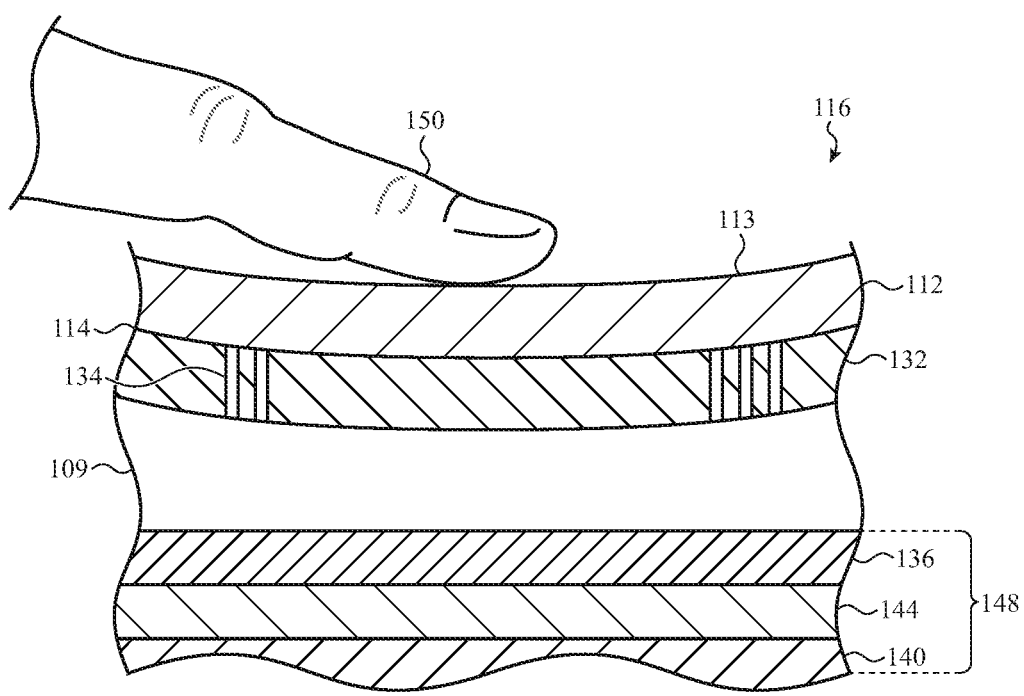
FIG. 2B depicts a cross-sectional view of the input region of FIG. 1A in an actuated position, taken along line A-A of FIG. 1A.

FIG. 2B depicts a functional cross-sectional view of the input region 116 of FIG. 1A. The input region 116 is shown in FIG. 2A in an actuated configuration, for example, in which input region 116 is receiving input from the user 150. As described herein, the enclosure wall 112 may be configured to locally or generally deform in response to a force input. This may be tactile imperceptible. Further, the bending or deformation of the enclosure wall 112 may be elastic such that the enclosure wall 112 substantially returns to an undeformed shape when the force ceases.

As shown in FIG. 2B, when the user 150 applies a force input to the external surface 113, the enclosure wall 112 may bend. The opaque masking layer 132, positioned on the underside surface 114, may bend as well. Accordingly, the opaque masking layer 132 may be pliable and/or resilient with respect to deformation or repeated bending of the enclosure wall 112. As such, the opaque masking layer 132 may not crack, splinter, or otherwise damage upon the bending of the enclosure wall 112. The input assembly 148 may detect the bending of the enclosure wall 112 to estimate the force input received within the input region 116 and/or determine one or more characteristics of the force input, such as magnitude. As one possibility, the sensing element 144 may measure a change in a gap between the opaque masking layer 132 and another structure or component within the internal volume 109 to detect the force input. For example, a capacitive sensor may measure variations in capacitance between electrodes positioned about the gap and determine a force input associated with the variations. In another embodiment, electrically conductive contact element of a contact-based switch may be positioned below the enclosure wall 112 and configured to contact one another in response to an input received within the input region 116, thereby triggering a switch event. Other techniques are contemplated for detecting the force input associated with the bending of the enclosure wall 112, and are described herein with respect to FIGS. 9A-9J.

Figure 2C:
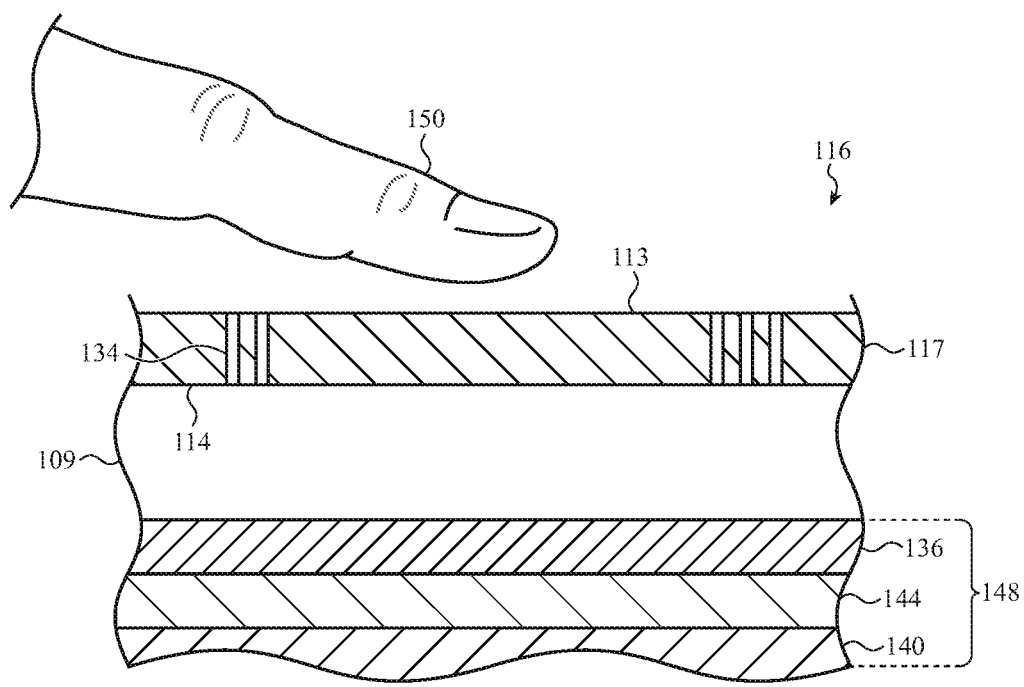
FIG. 2C depicts a cross-sectional of another embodiment of the input region of FIG. 1A in an unactuated position, taken along line A-A of FIG. 1A.

FIG. 2C depicts a functional cross-sectional view of an alternate embodiment of the input region 116 of FIG. 1A. The input region 116 is shown in FIG. 2C in an unactuated configuration, for example, in which the input region 116 is not receiving an input.

In the embodiment of FIG. 2C, the input region 116 may be associated with a cross-section or region of the electronic device 104 that includes an opaque wall 117, the array of microperforations 134, the light source 136, the haptic structure 140, and the sensing element 144. The opaque wall 117 may define the external surface of 113 of the electronic device 104. For example, the enclosure wall 112 may be a metal layer that forms a portion of the enclosure wall (e.g., such enclosure wall 112 of FIG. 1A). The opaque wall 177 may be formed from a metal material, plastic, ceramic, composite, synthetic or other component that substantially blocks the passage of light into the interior volume of the enclosure 109.

As shown in FIG. 2C, the array of microperforations 134 may be defined by the opaque wall 117 and allow light to pass between an interior and exterior of the electronic device 104. For example, the array of microperforations 134 may be holes, openings, through portions, or the like that extend through a complete thickness of the opaque wall 117. The array of microperforations 134 may be configured to be visually imperceptible on the opaque wall 117 when unilluminated. When illuminated, for example, by the light source 136, the array of microperforations 134 may define or form an illuminated symbol within the input region 116.

Figure 2D:
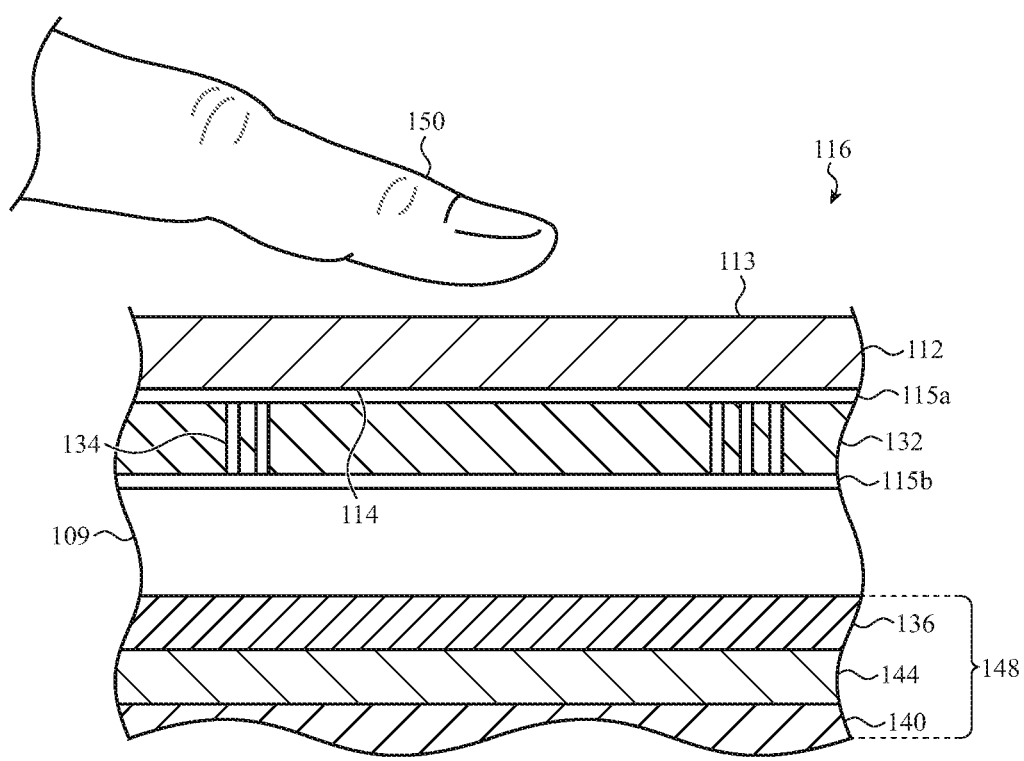
FIG. 2D depicts a cross-sectional view of another embodiment of the input region of FIG. 1A in an unactuated position, taken along line A-A of FIG. 1A.

FIG. 2D depicts a functional cross-sectional view of an alternate embodiment of the input region 116 of FIG. 1A. The input region 116 is shown in FIG. 2C in an unactuated configured, for example, in which the input region 116 is not receiving an input.

In the embodiment of FIG. 2D, the input region 116 may be associated with a cross-section or region of the electronic device 104 that includes one or more intermediate layers. For example, as shown in FIG. 2D, the electronic device 104 may include intermediate layers 115a, 115b. The intermediate layer 115a may be positioned between the enclosure wall 112 and the opaque masking layer 132. The intermediate layer 115b may be positioned between the opaque masking layer 132 and the input assembly 148. The intermediate layers 115a, 115b may provide a moisture barrier or other transitional layer between one or more of the components of the electronic device 104. The PET layers 115a, 115b may be translucent (e.g., transparent, partially transparent, or otherwise able to transmit light). This may allow light generated by the light source 136 to propagate through the array of microperforations 134 and defined a symbol within the input region 116 on the enclosure wall 112. The intermediate layers 115a, 115b may be formed from, or include, polyethylene terephthalate (PET), silicon, glass sheet, ceramic sheet, or the like, however, other material are possible, including plastics, synthetics, composites, and so on.

Figure 3A:
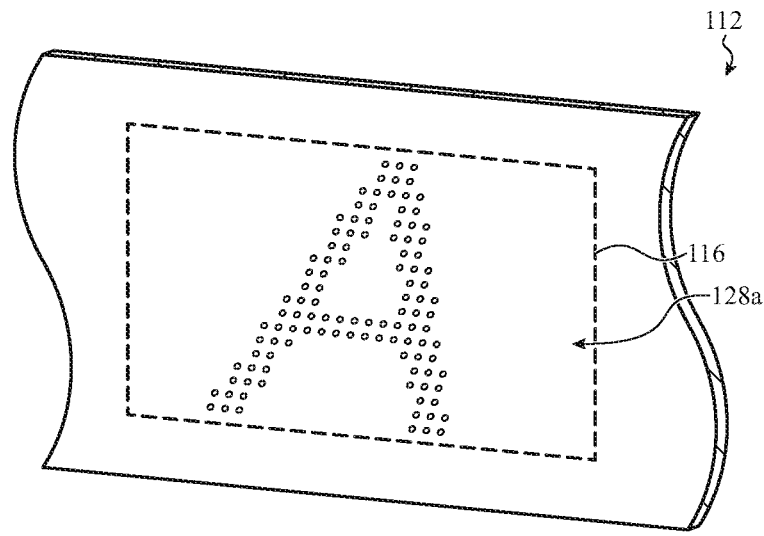
FIG. 3A depicts an enlarged view of the input region of FIG. 1A having a first displayed symbol.
Figure 3B:
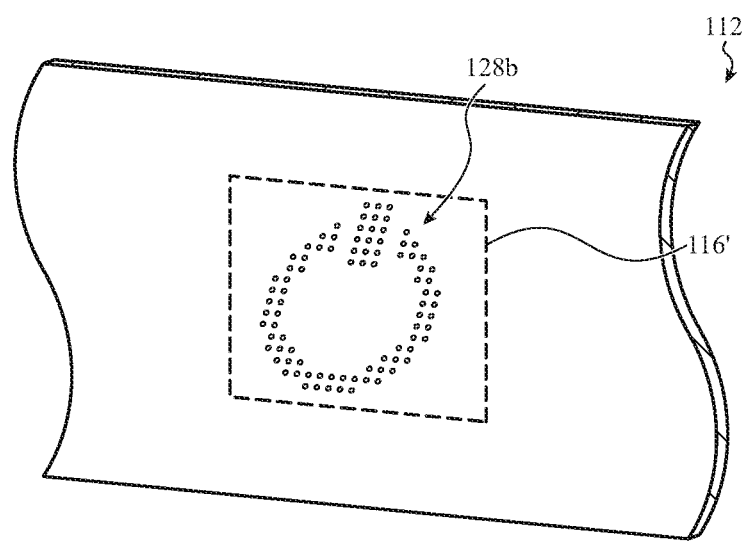
FIG. 3B depicts an enlarged view of the input region of FIG. 1A having a second displayed symbol.
Figure 3C:
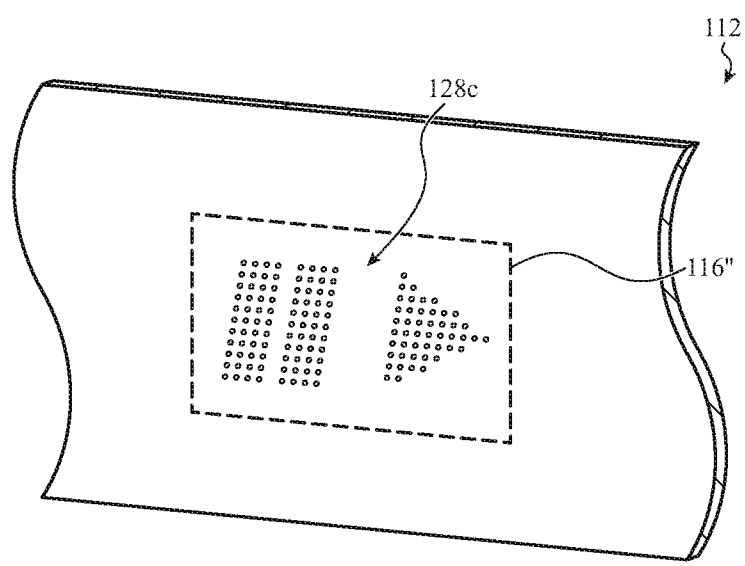
FIG. 3C depicts an enlarged view of the input region of FIG. 1A having a third displayed symbol.

FIGS. 3A-3C depict the enclosure wall 112 having the input region 116, as described above, in various illuminated configurations or modes. The input region 116 may be used to control multiple, distinct functions of the electronic device 104 and/or display or convey various distinct indications or notifications associated with the electronic device 104. In this regard, the electronic device 104 may be configured to illuminate multiple, distinct symbols within the input region 116. For example, as described above with respect to FIG. 2A, the light source 136 may illuminate various subsets of the array of microperforations 134 that correspond or form various different symbols. The array of microperforations 134 shown with respect to FIGS. 3A-3C for purposes of illustration only, and is not intended to convey scale. Rather, the array of microperforations 134 is depicted in FIGS. 3A-3C to demonstrate the principles described herein.

The illuminated symbol may correspond to a function of the input region 116. For example and as described in greater detail below with respect to FIGS. 10A-13, a processing unit may be positioned within the enclosure 108 (or otherwise operatively coupled with the electronic device 104) and configured to define the input region 116 on the enclosure wall 112. The processing unit may also be configured to associate the input region 116 with a particular function of the electronic device 104, including an alpha-numeric command, a media playback command, a power command, among other possibilities. Accordingly, the input assembly 148 may be operatively coupled with the processing unit and configured to selectively illuminate the array of microperforations 134 such that the light source 136 illuminates a subset of the array of microperforations 134 that collectively form a symbol corresponding to the function of the input region 116. Individual ones of the array of microperforations 134 may not be distinguishable from one another when viewed at an appropriate distance, and thus the illuminated symbol may appear solid or uniform. Substantially analogously, the input assembly 148 may trigger a switch event and/or generate a haptic output corresponding to the function of the input region 116 when the translucent region receives an input.

With reference to FIG. 3A, the enclosure wall 112 may include, in a first mode, a symbol 128a in the input region 116. The symbol 128a may be a first illuminated symbol formed or defined by a first subset of the array of microperforations 134. As such, the light source 136 may illuminate the first subset of the array of microperforations 134 to display the symbol 128a within the input region 116. The symbol 128a may indicate that the input region 116 may be used to provide input to the electronic device 104 associated with the letter "A." A processing unit, coupled with the input region 116, may produce a first input signal or a first switch event in response to detecting the input, which may be used to control a function of the electronic device 104 associated with the symbol 128a. In this regard, a graphical output of a display of the electronic device 104 (e.g., display 120 of FIG. 1A) may be modified in a first manner in response to input received within the input region 116 when the symbol 128a is illuminated. Haptic outputs may be provided to the input region 116 upon receiving input, which may correspond to the symbol 128a. In some cases, the symbol 128a may also provide a notification to the user 150 associated with a status of the electronic device 104.

With reference to FIG. 3B, the enclosure wall 112 may include, in a second mode, a symbol 128b in the input region 116'. The symbol 128b may be a second illuminated symbol formed or defined by a second subset of the array of microperforations 134. As such, the light source 136 may illuminate the second subset of the array of microperforations 134 to display the symbol 128b within the input region 116'. The symbol 128b may indicate that the input region 116' may be used to provide input to the electronic device 104 associated with a power button. A processing unit, coupled with the input region 116', may produce a second input signal or a second switch event in response to detecting the input, which may be used to control a function of the electronic device 104 associated with the symbol 128b. In this regard, a graphical output of a display of the electronic device 104 (e.g., display 120 of FIG. 1A) may be modified in a second manner in response to input received within the input region 116' when the symbol 128b is illuminated. Haptic outputs may be provided to the input region 116' upon receiving input, which may correspond to the symbol 128b. In some cases, the symbol 128b may also provide a notification to the user 150 associated with a status of the electronic device 104.

With reference to FIG. 3C, the enclosure wall 112 may include, in a third mode, a symbol 128c in the input region 116". The symbol 128c may be a third illuminated symbol formed or defined by a third subset of the array of microperforations 134. As such, the light source 136 may illuminate the third subset of the array of microperforations 134 to display the symbol 128c within the input region 116". The symbol 128c may indicate that the input region 116" may be used to provide input to the electronic device 104 associated with a media playback function. A processing unit, coupled with the input region 116", may produce a third input signal or a third switch event in response to detecting the input, which may be used to control a function of the electronic device 104 associated with the symbol 128c. In this regard, a graphical output of a display of the electronic device 104 (e.g., display 120 of FIG. 1A) may be modified in a third manner in response to input received within the input region 116" when the symbol 128c is illuminated. Haptic outputs may be provided to the input region 116" upon receiving input, which may correspond to the symbol 128c. In some cases, the symbol 128c may also provide a notification to the user 150 associated with a status of the electronic device 104.

It will be appreciated that the symbols 128a, 128b, 128c may define a boundary of respective ones of the input regions 116, 116', 116". In this regard, the symbols 128a, 128b, 128c may define a modified boundary of the input regions 116, 116', 116" based on the size, shape, and/or other characteristic of the particular illuminated symbol. For example, each of the symbols 128a, 128b, 128c may be defined by a distinct size and/or have a distinct illuminable surface area. The input regions 116, 116', 116" may thus be resized and modified based on the illumination of a particular one of the symbols 128a, 128b, 128c with the input region 116. To illustrate, the symbol 128a may define a boundary of the input area 116, the symbol 128b may define a modified boundary of the input area 116', and the symbol 128c may define a second modified boundary of the input area 116". As such, the sensing element 140, described with respect to FIG. 2A, may be responsive to input received within the boundary of the input region 116 when the symbol 128a is illuminated, input received within the modified boundary of the input region 116' when the symbol 128b is illuminated, and/or input received within the second modified boundary of the input region 116" when the symbol 128c is illuminated. This may facilitate use of the input regions 116, 116', 116" as a dynamic input surface used to control multiple functions of the electronic device 104.

The symbols 128a, 128b, 128c depicted in FIGS. 3A-3C are shown to illustrate the formation of the symbols 128a, 128b, 128c using the array of microperforations 134. As described above, the array of microperforations 134 may be visually imperceptible when not illuminated. Accordingly, given the relative size of the microperforations, the symbols 128a, 128b, 128c may appear to be formed from continuous or unbroken lines when viewed at an appropriate distance.

Figure 4:
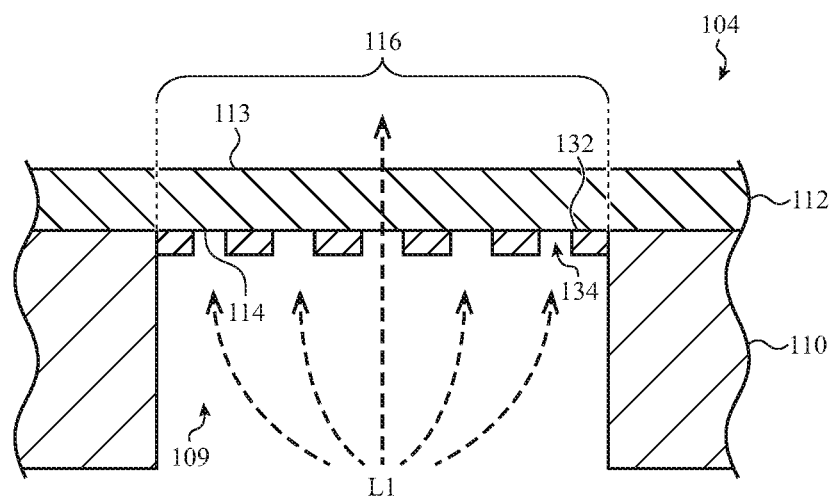
FIG. 4 depicts a simplified cross-sectional view of the input region of FIG. 1A, taken along line A-A of FIG. 1A.

FIG. 4 depicts a cross-sectional view of the input region 116 of FIG. 1A, taken along line A-A of FIG. 1A. As shown in FIG. 4, light may propagate along light path L1 and define a symbol within the input region 116. The input region 116 may be used to control a function of the electronic device 104 in response to an input. For the sake of clarity, some elements associated with the input region 116 have been omitted in FIG. 4.

As described above, the enclosure wall 112 may form an exterior surface of the electronic device 104, such as external surface 113. The enclosure wall 112 may be positioned over, and at least partially define, the interior volume 109 of the electronic device 104. The interior volume 109 may include support structures 110. The support structures 110 may be columns, beams, pedestals, posts, or other like structures that are used to support one or more components within the enclosure 108. As shown in FIG. 4, the support structure 110 may be configured to support or maintain a position of the enclosure wall 112. The support structure 110 may also define a section of the interior volume 109 within which the enclosure wall 112 may bend in response to a force. For example, the enclosure wall 112 may extend between two support structures 110 and bend into a section of the interior volume 109 in response to a force input.

Light path L1 may emanate from within the interior volume 109 and travel towards the external surface 113 to illuminate a symbol within the input region 116. A light source (not shown in FIG. 4), may be positioned within the interior volume 109 and emit light toward the opaque masking layer 132 substantially along light path L1. The opaque masking layer 132 may generally block light. However, the array of microperforations 134 defined by the opaque masking layer 132 may allow light to travel through to the enclosure wall 112 position above. The light path L1 may thus extend through some or all of the array of microperforations 134 and into the enclosure wall 112. The light path L1 may continue through the enclosure wall 112 along a direction substantially corresponding to a direction of the array of microperforations 134 through which the light path L1 passes. Accordingly, the light path L1 may reach the external surface 113 and create the appearance of an illuminated symbol within the input region 116 corresponding to the configuration or arrangement of the illuminated array of microperforations 134.

FIGS. 5A-5F depict various configurations of the opaque masking layer 132. In particular, FIGS. 5A-5F depict various configurations, arrangements, shapes, sizes, patterns, and so on of microperforations defined by the opaque masking layer 132. The microperforations may generally be visually imperceptible holes, openings, or through portions that extend through a complete thickness of the opaque masking layer 132. The microperforations may be defined by curved edges formed within the opaque masking layer 132. Light may pass through the opaque masking layer 132 at the microperforations. In some cases, a shape, size, dimension, or other physical property of microperforations may be tuned or modified to control an optical characteristic of an illuminated symbol defined within the input region 116, as described in greater detail below.

Figure 5A:
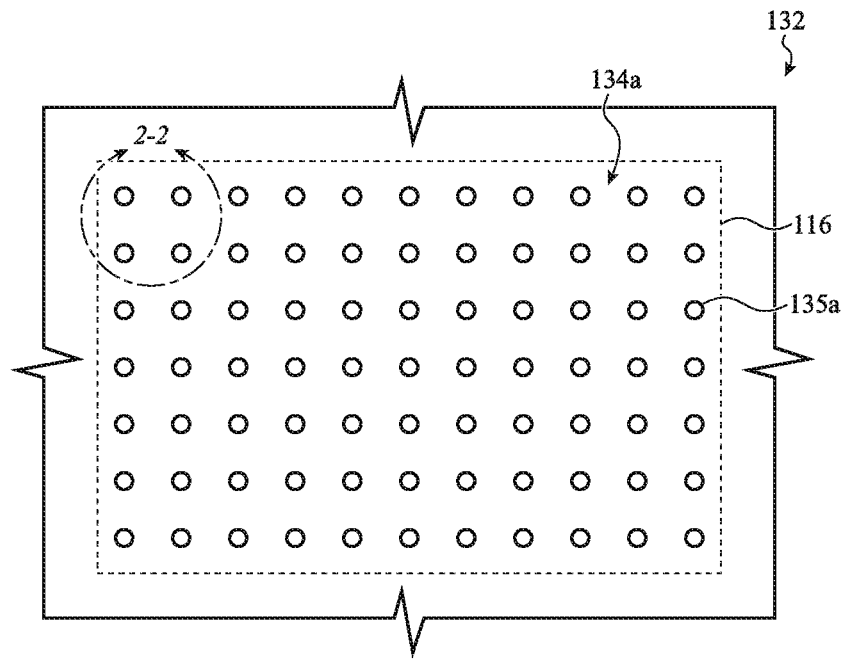
FIG. 5A depicts a top view of an opaque masking layer having an array of microperforations.

With reference to FIG. 5A, the opaque masking layer 132 is shown as defining an array of microperforations 134a within the input region 116. The array of microperforations 134a may be arranged in a grid or matrix pattern across the input region 116. The array of microperforations 134a may include microperforation 135a. The microperforation 135a may be a substantially circular opening extending through a thickness of the opaque masking layer 132. Some or all of the array of microperforations 134a may be illuminated to display one or more symbols within the input region 116.

Figure 5B:
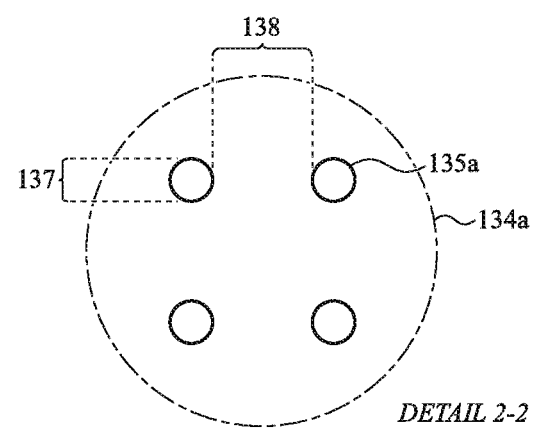
FIG. 5B depicts detail 2-2 of the array of microperforations of FIG. 5A.

FIG. 5B depicts detail 2-2 of FIG. 5A of the array of microperforations 134a. As shown in the non-limiting example of FIG. 5B, the microperforation 135a may have a width 137. The width 137 may be a cross-dimension of the microperforation 135a. The width 137 may be within a range of 30 microns to 80 microns, such as being within a range of 10 to 30 microns or a range of 80 to 100 microns. In some cases, the width 137 may be less than 10 microns or greater than 100 microns. For example, the width 137 may be 130 microns or greater. In either case, the microperforations may be visually imperceptible to a user. As such, when not illuminated, the microperforations may be concealed, camouflaged, hidden, and so forth, such as being concealed below an exterior surface of a device. This may allow the input functionality of the device to be disguised when the device is off, as described herein.

The microperforation 135a may also be separated from other microperforations within the array of microperforations 134a by a separation 138. The separation 138 may be indicative of a density or resolution of the array of microperforations 134a. The separation 138 may be within a range of 80 microns to 500 microns. In some cases, the separation 138 may be less than 80 microns or greater than 500 microns, such as being within a range of 50 microns to 80 microns or 500 microns to 600 microns.

The width 137 and the separation 138 may be configured to conceal the input region 116 when the electronic device 104 is in an unilluminated configuration. The array of microperforations 134a may be formed across the opaque masking layer 132 such that the width 137 and the separation 138 cause the array of microperforations 134a to be invisible to the unaided human eye along the external surface 113 of the enclosure wall 112. The width 137 and the separation 138 may also be selected to alter an optical characteristic of an illuminated symbol. For example, the width 137 and/or the separation 138 may be operative to control one or more of a sharpness, contrast, brightness, color, optimal viewing angle, or other associated property of a symbol illuminated within the input region 116. For example, as the width 137 increases, an illuminated symbol may appear brighter, whereas as the separation 138 decreases, the sharpness of the lines of formed by the illuminated symbol may increase.

Figure 5C:
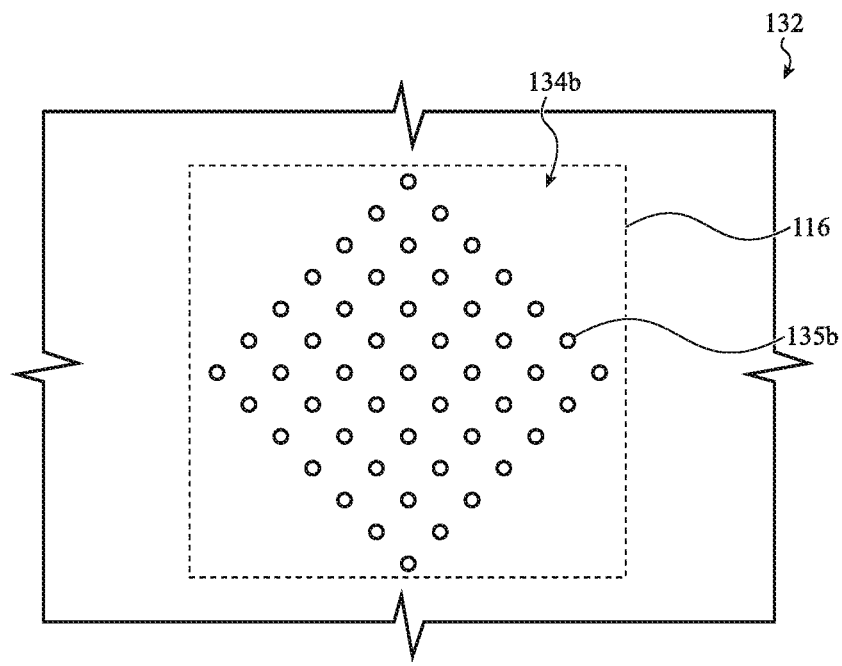
FIG. 5C depicts a top view of an opaque masking layer having an array of microperforations arranged in an alternate configuration.

With reference to FIG. 5C, the opaque masking layer 132 is shown as defining an array of microperforations 134b within the input region 116. The array of microperforations 134b may be arranged in a grid or matrix pattern that forms a diamond across the input region 116. For example, the array of microperforations 134b may be arranged in a diamond-shaped grid across the opaque masking layer 132. The array of microperforations 134b may include microperforation 135b. The microperforation 135b may be a substantially circular opening extending through a thickness of the opaque masking layer 132. Some or all of the array of microperforations 134b may be illuminated to display one or more symbols within the input region 116.

Figure 5D:
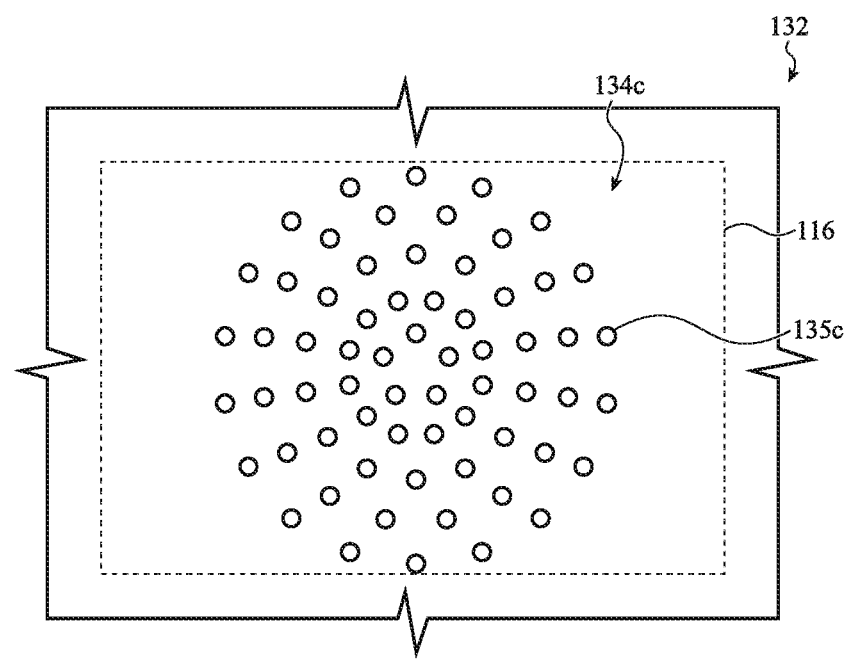
FIG. 5D depicts a top view of an opaque masking layer having an array of microperforations arranged in an offset-in configuration.

With reference to FIG. 5D, the opaque masking layer 132 is shown as defining an array of microperforations 134c within the input region 116. The array of microperforations 134c may be arranged in a circular pattern across the input region 116. In particular, the array of microperforations 134c may be defined in an "off-set in" pattern, in which the array of microperforations 134c are arranged inward from an outermost ring of the array of microperforations 134c. The array of microperforations 134c may include microperforation 135c. The microperforation 135c may be a substantially circular opening extending through a thickness of the opaque masking layer 132. Some or all of the array of microperforations 134c may be illuminated to display one or more symbols within the input region 116.

Figure 5E:
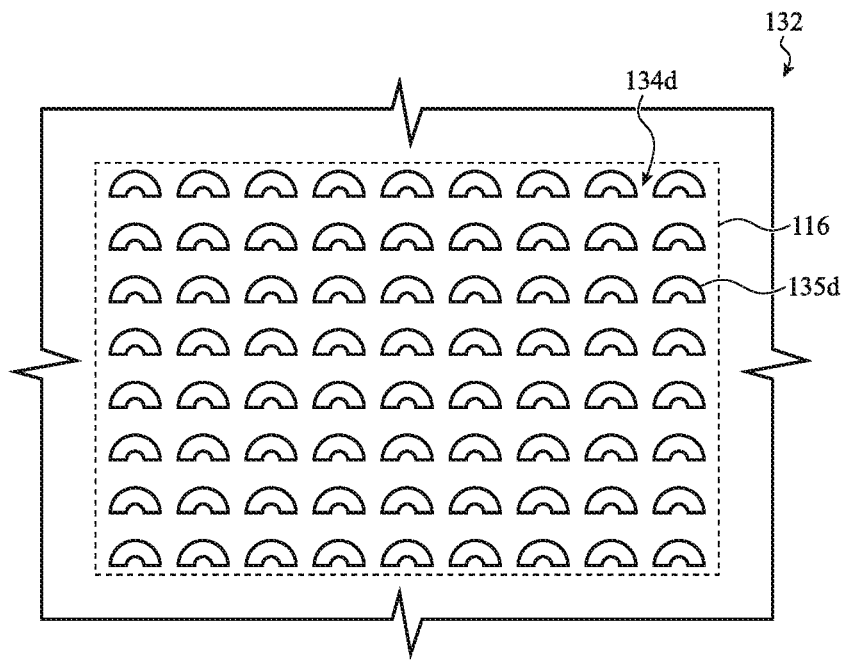
FIG. 5E depicts a top view of an opaque masking layer having an array of microperforations defined by an alternate shape.

With reference to FIG. 5E, the opaque masking layer 132 is shown as defining an array of microperforations 134d within the input region 116. The array of microperforations 134d may be arranged in a grid or matrix pattern across the input region 116. The array of microperforations 134d may include microperforation 135d. The microperforation 135d may be a substantially curved or contoured semi-circular or arch-shaped opening extending through a thickness of the opaque masking layer 132. Some or all of the array of microperforations 134d may be illuminated to display one or more symbols within the input region 116.

Figure 5F:
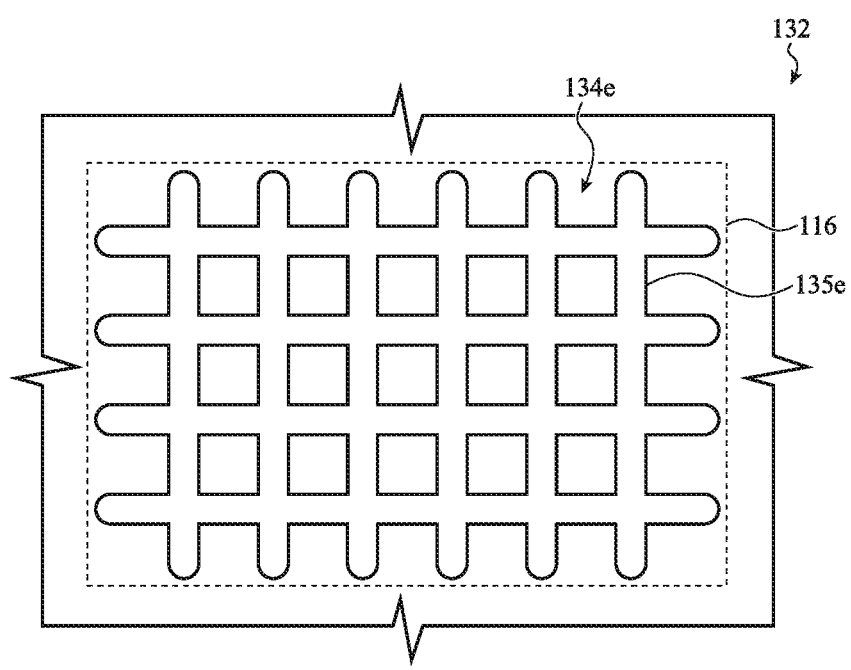
FIG. 5F depicts a top view of an opaque masking layer having an array of microperforations defined by a cross-hatch pattern.

With reference to FIG. 5F, the opaque masking layer 132 is shown as defining an array of microperforations 134e within the input region 116. The array of microperforations 134e may be arranged in a cross-hatched pattern across the input region 116. The array of microperforations 134e may include microperforation 135e. The microperforation 135e may be substantially elongated openings perpendicularly or laterally arranged on the opaque masking layer 132 and extending through a thickness of the opaque masking layer 132. Some or all of the array of microperforations 134e may be illuminated to display one or more symbols within the input region 116.

Figure 6A:
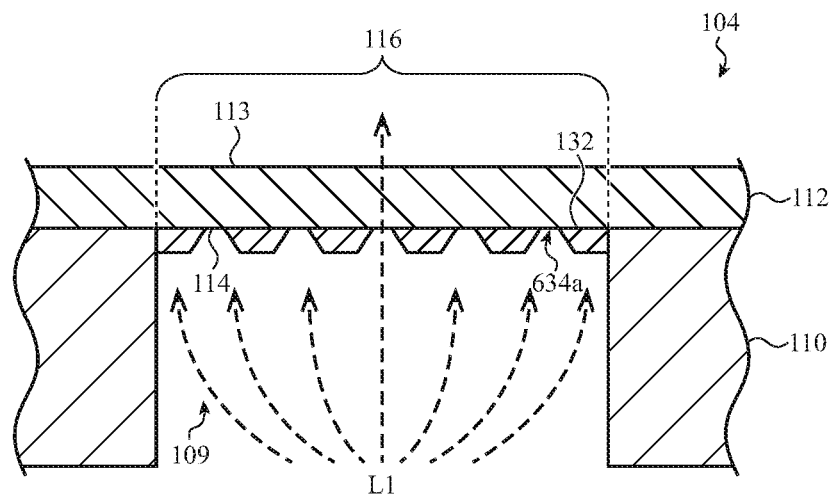
FIG. 6A depicts a cross-sectional view of the input region of FIG. 1A having an opaque masking layer in a first tapered configuration, taken along line A-A of FIG. 1A.
Figure 6B:
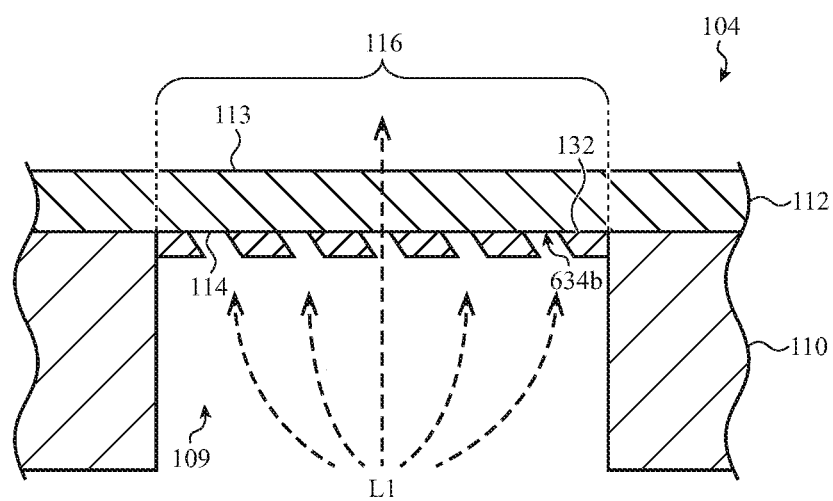
FIG. 6B depicts a cross-sectional view of the input region of FIG. 1A having an opaque masking layer in a second tapered configuration, taken along line A-A of FIG. 1A.

FIGS. 6A-6B depict various configurations of the opaque masking layer 132. A thickness of the opaque masking layer 132 may extend into the interior volume 109. An array of microperforations, such as the array of microperforations 134 described above with respect to FIGS. 1A-5F, may be openings or through portions that extend through the thickness of the opaque masking layer 132. In some cases, the array of microperforations 134 may have a non-uniform cross-section across the thickness of the opaque masking layer 132, for example, such that a portion of a sidewall defined by a given microperforation may be angled, tapered, chamfered, or the like with respect to the underside surface 114 of the enclosure wall 112. The non-uniform or variable cross-section of the array of microperforations 134 may influence the optical characteristics of a symbol or other indicia illuminated on the external surface 113. this may also help define a particular viewing angle, or viewing cones relative to the enclosure wall 112, for example, by helping to direct light within the viewing cone.

With reference to FIG. 6A, a cross-sectional view of the input region 116 of FIG. 1A is shown, taken along line A-A of FIG. 1A. As shown, the opaque masking layer 132 may include or define an array of microperforations 634a. The array of microperforations 634a may extend through a complete thickness of the opaque masking layer 132 and may allow light to pass from the interior volume 109 to the external surface 113 of the input region 116.

The array of microperforations 634a may have a non-uniform cross-section along a thickness the opaque masking layer 132. For example, each of the array of microperforations 634a may have an angled or tapered sidewall that extends through the thickness of the opaque masking layer 132. In a particular embodiment, the cross-section of the array of microperforations 134a may be greater at the interior volume 109 than at the underside surface 114. This may allow the opaque masking layer 132 to focus and or selectively direct light to the external surface 113.

With reference to FIG. 6B, a cross-sectional view of the input region 116 of FIG. 1A is shown, taken along line A-A of FIG. 1A. As shown, the opaque masking layer 132 may include or define an array of microperforations 634b. The array of microperforations 634b may extend through a complete thickness of the opaque masking layer 132 and may allow light to pass from the interior volume 109 to the external surface 113 of the input region 116.

The array of microperforations 634b may have a tapered or angled cross-section along a thickness the opaque masking layer 132. For example, each of the array of microperforations 634b may extend through the opaque masking layer 132 at an angle This may allow the opaque masking layer 132 to focus and/or selectively direct light to the external surface 113. In a particular embodiment, the viewing angle or viewing cone may be decreased using the array of microperforations 634b. For example, the array of microperforations 634b may focus light emitted from within the interior volume in a narrow or constrained manner.

Figure 7A:
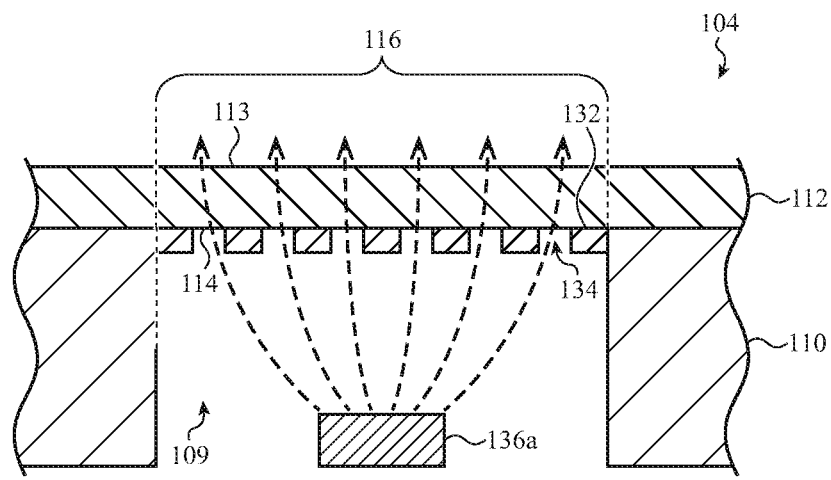
FIG. 7A depicts a cross-sectional view of the input region of FIG. 1A having a LED positioned below a translucent layer, taken along line A-A of FIG. 1A.
Figure 7B:
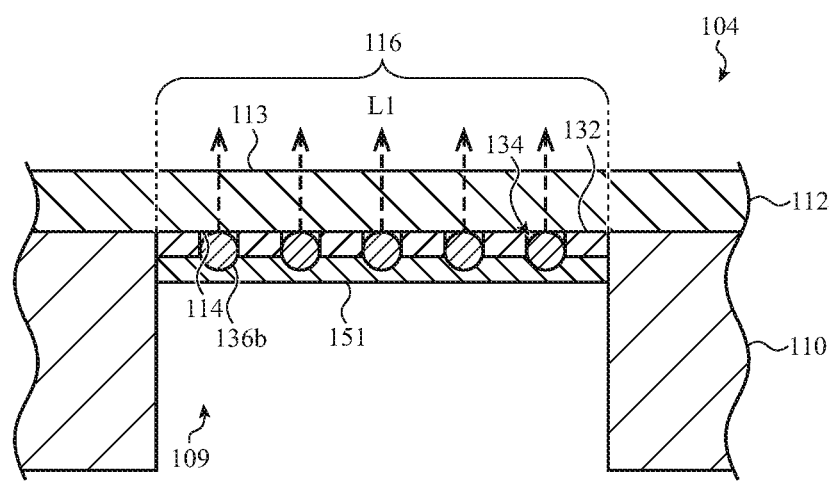
FIG. 7B depicts a cross-sectional view of the input region of FIG. 1A having an array of micro-LEDs positioned below a translucent layer, taken along line A-A of FIG. 1A.
Figure 7C:
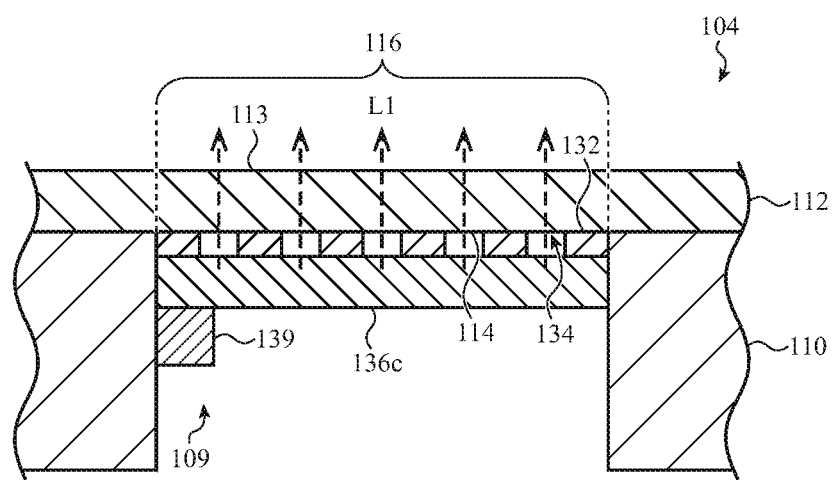
FIG. 7C depicts a cross-sectional view of the input region of FIG. 1A having an array of micro-LEDs positioned below a translucent layer, taken along line A-A of FIG. 1A.

FIGS. 7A-7C depicts various configurations of a light source, such as light source 136 described above with respect to FIGS. 2A and 2B. In particular, FIGS. 7A-7C depict sample components and configurations to be used to deliver light through the array of microperforations 134 and cause a symbol or other indicia to be illuminated at the input region 116. It will be appreciated that the following components associated with, or forming, the light source are presented for purposes of illustration only. Other components that are configured to deliver light through the array of microperforations 134 are contemplated within the present disclosure.

With reference to FIG. 7A, a cross-sectional view of the input region 116 of FIG. 1A is shown, taken along line A-A of FIG. 1A. As shown, the electronic device 104 includes a light source 136a positioned below the enclosure wall 112 and within the interior volume 109. The light source 136a may function in a manner substantially analogous to the light source 136 described above with respect to FIGS. 2A and 2B. For example, the light source 136a may be configured to propagate light along light path L1 that extends from within the interior volume 109, through the array of microperforations 134, and toward the external surface 113 to define a symbol or glyph within the input region 116.

In the embodiment of FIG. 7A, the light source 136a may be a light emitting diode (LED). The light source 136a may project or generate light from a single position within the interior volume 109. This may illuminate all or substantially all of the array of microperforations 134.

With reference to FIG. 7B, a cross-sectional view of the input region 116 of FIG. 1A is shown, taken along line A-A of FIG. 1A. As shown, the electronic device 104 includes a light source 136b positioned below the enclosure wall 112. The light source 136b may function in a manner substantially analogous to the light source 136 described above with respect to FIGS. 2A and 2B. For example, the light source 136b may be configured to propagate light along light path L1 that extends through the array of microperforations 134, and toward the external surface 113 to define a symbol or glyph within the input region 116.

In the embodiment of FIG. 7B, the light source 136b may be an array of micro-LEDs. The array of micro-LEDs may be positioned on a membrane 151 and arranged relative to the array of microperforations 134. For example, in one embodiment, micro-LEDs of the array of micro-LEDs may be positioned within corresponding ones of the array of microperforations 134. Additionally or alternately, micro-LEDs of the array of micro-LEDs may be positioned below or adjacent to particular groups of microperforations. Micro-LEDs of the array of micro-LEDs may be selectively actuated to illuminate particular ones or groups of the array of microperforations 134. This may allow the electronic device 104 to display multiple distinct symbols or glyphs within the input region 116 and subsequently use the input region 116 to control multiple functions of the electronic device 104.

With reference to FIG. 7C, a cross-sectional view of the input region 116 of FIG. 1A is shown, taken along line A-A of FIG. 1A. As shown, the electronic device 104 includes a light source 136c positioned below the enclosure wall 112 and within the interior volume 109. The light source 136c may function in a manner substantially analogous to the light source 136 described above with respect to FIGS. 2A and 2B. For example, the light source 136c may be configured to propagate light along light path L1 that extends from within the interior volume 109, through the array of microperforations 134, and toward the external surface 113 to define a symbol or glyph within the input region 116.

In the embodiment of FIG. 7C, the light source 136c may be a light guide. The light guide may direct light through the interior volume 109. For example, the light guide may be coupled with a light emitting element, such as light emitting element 139, within the interior volume 109 and direct light from the light emitting element toward the input region 116. The light guide may define one or more light extraction features that may cause light to propagate toward one or more of the array of microperforations, and thereby exiting the light guide. The light guide may therefore cause the array of microperforations to be illuminated in various configurations.

Figure 8A:
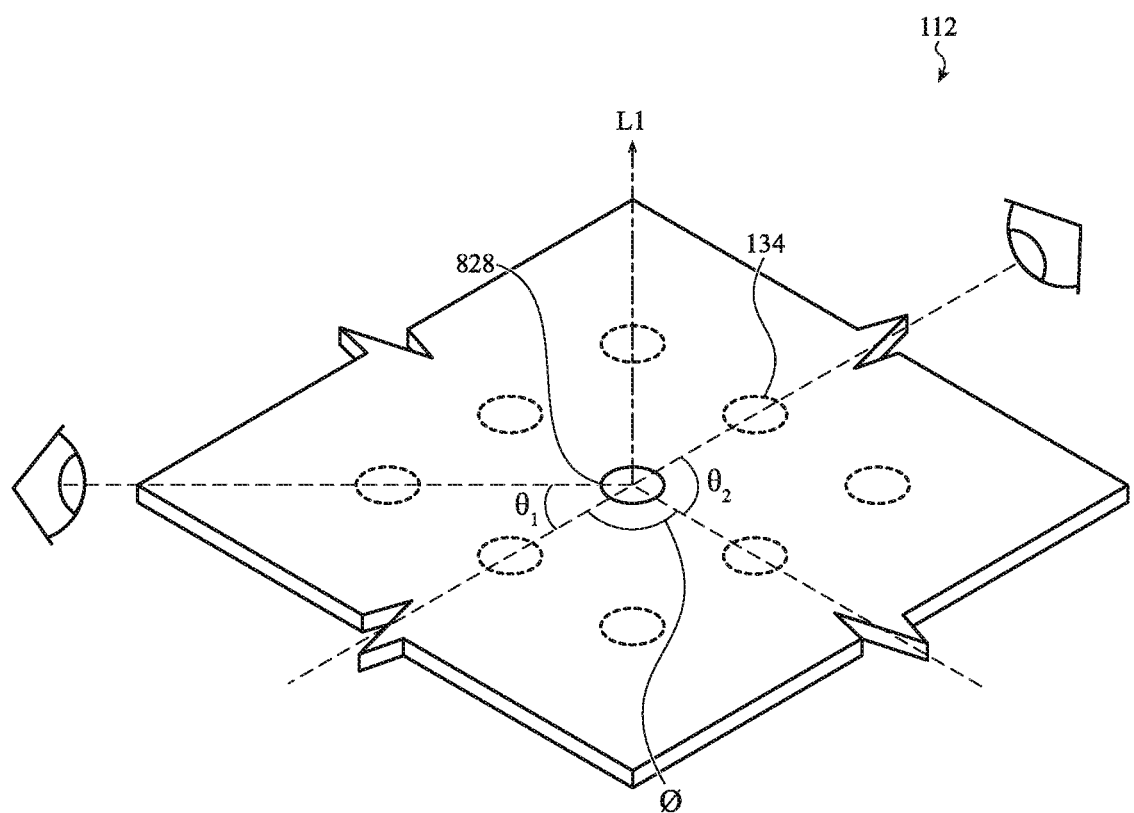
FIG. 8A depicts a perspective view of a translucent layer that emits light having various properties at distinct viewing angles.
Figure 8B:
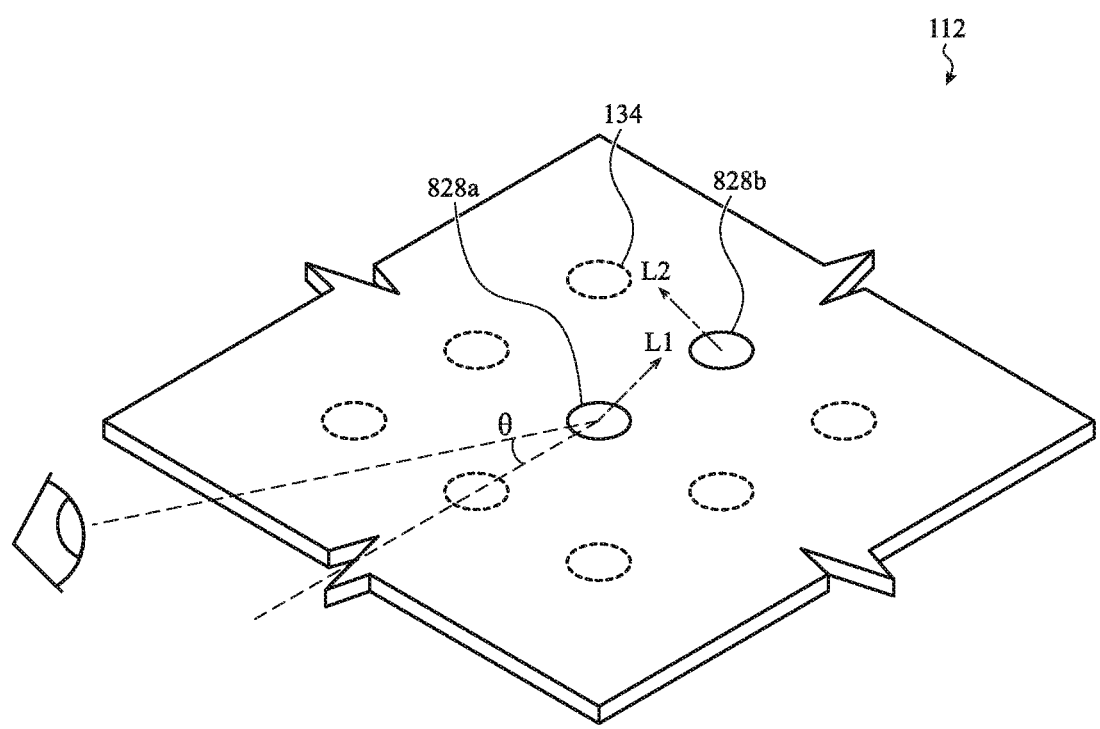
FIG. 8B depicts a perspective view of a translucent layer that emits light having an interference pattern.

FIGS. 8A and 8B depict various optical characteristics of a symbol, glyph, or other indicia illuminated on the enclosure wall 112. As described herein, the electronic device 104 may be configured to illuminate one or more symbols on the enclosure wall 112 that may be indicative of a function, notification, or the like of the electronic device 104. For example, a light source positioned below the enclosure wall 112 may propagate light from within the electronic device 104 and through an array of microperforations defined in an opaque masking layer along an underside of the enclosure wall 112 such that the enclosure wall 112 displays an illuminated symbol. The opaque masking layer 132 and/or the light source may be configured to cause the illuminated symbol on the enclosure wall 112 to exhibit various optical characteristics, including a specified sharpness, contrast, brightness, color, optical viewing angle, and so on.

With reference to FIG. 8A, the enclosure wall 112 is shown. Positioned below the enclosure wall 112 is the opaque masking layer 132 (not shown) that defines the array of microperforations 134 (shown in phantom). Light may propagate through the array of microperforations 134 to display an illuminated symbol on the enclosure wall 112. As shown in FIG. 8A, the enclosure wall 112 may include an illuminated symbol 828.

The illuminated symbol 828 may exhibit various optical characteristics at the enclosure wall 112 at different viewing angles. For example, an optical characteristic of the illuminated symbol 828 at angle θ1 may be distinct from an optical characteristic of the illuminated symbol 828 at angle θ2. To illustrate, when viewed at θ1, the illuminated symbol may have a first brightness, sharpness, contrast, and so on, whereas when viewed at θ2, the illuminated symbol may have a second brightness, sharpness, contrast, and so on. This may be at least partially influenced by the array of microperforations that underlie the enclosure wall 112. For example, the array of microperforations 134 may have a size, shape, spacing, or other characteristic that causes the illuminated symbol 828 to have distinct optical characteristics at the angles θ1, θ2. Additionally or alternatively, light may be propagated through the array of microperforations 134 to cause the distinct optical characteristics.

In some cases, the array of microperforations 134 may be used to define a viewing cone. For example, the array of microperforations 134 may cause the illuminated symbol 828 to exhibit optical characteristics that cause the illuminated symbol 828 to be visible within a specified region of three-dimensional space. In this regard, the viewing come may extend from the illuminated symbol 828 and represent a region of three-dimensional space in which the symbol 828 may be visible. As shown in FIG. 8A, each of the depicted viewing or incident angles θ1, θ2 may be separated from one another by a radial separation φ. The radial separation φ may define a boundary of the viewing cone. As such, the electronic device 104 may display the illuminated symbol 828 on the enclosure wall 112 in a manner that is visible within the radial separation φ, but invisible or otherwise obscured outside of the viewing cone. In this regard, more broadly, by having distinct optical characteristics at distinct viewing angles, the electronic device 104 may be configured to display an illuminated symbol on the enclosure wall 112 in a manner that is visible to a user, while being invisible, obscured, or otherwise unrecognizable to a by-stander or others within the vicinity of the electronic device 104.

With reference to FIG. 8B, the enclosure wall 112 is shown. Positioned below the enclosure wall 112 is the opaque masking layer 132 (not shown) that defines the array of microperforations 134 (shown in phantom). Light may propagate through the array of microperforations 134 to display an illuminated symbol on the enclosure wall 112. As shown in FIG. 8B, the enclosure wall 112 may include illuminated symbols 828*a* and 828*b*.

The electronic device 104 may be configured to propagate light through the particular ones, or groups of the array of microperforations 134 along distinct light paths. Light traveling on the distinct light paths may constructive or destructively interfere with one another and create various optical effects, such as optical diffraction. For example, the illuminated symbol 828*a* may be illuminated by light traveling along light path L1, whereas the illuminated symbol 828*b* may be illuminated by light traveling along light path L2. Light paths L1, L2 may be calibrated to interfere with one another, for example, such that light from each of the light paths L1, L2 combine or cooperate to form a new light path and corresponding light wave. When viewed at an appropriate distance, the new light path may exhibit the desired optical effects, including a desired contrast, brightness, and/or color.

The interference of light propagated along light paths L1, L2 may be at least partially influenced by the array of microperforations 134 that underlie the enclosure wall 112. For example, the array of microperforations 134 may have various different sizes, shapes, spacings, or the like that cause light to propagate through the array of microperforations 134 along distinct light paths. Additionally or alternatively, light may be directed to particular ones of the array of microperforations 134 in order to cause light to travel along a distinct light path. By creating an interference pattern between distinct light paths, the electronic device 104 may be configured to display illuminated symbols on the enclosure wall 112 having unique effects particular to the resulting interference light path or light wave.

FIGS. 9A-9J depict cross-sectional views of the input region 116 of FIG. 1A, taken along line A-A of FIG. 1A. In particular, FIGS. 9A-9J depict various sensing elements and haptic structures positioned below the enclosure wall 112. The sensing elements and haptic structures may be sensing elements and/or haptic structures may be are configured to detect input received within the input region 116 and/or deliver a haptic output, for example, such as the haptic structures 140 and the sensing elements 144 described above with respect to FIGS. 2A-2D. In this regard, the sensing elements and haptic structures described with respect to FIGS. 9A-9J may be, form, or include one or more of the haptic structure 140 and/or the sensing element 144 described above with respect to FIGS. 2A-2D. It will be appreciated that the sensing elements and haptic structures shown with respect to FIGS. 9A-9J are shown and described for purposes of illustration only; the electronic device 104 may include multiple different combinations of sensing elements and haptic structures described herein, including other sensing elements and haptic structures configured to detect input within the input region 116 and/or deliver a tactile output as may be appropriate for a given application. As described below, at least some portion or segment of the sensing elements and haptic structures described with respect to FIGS. 9A-9J may be translucent or otherwise capable of allowing some light to pass. In this regard, the sensing elements and haptic structures may support or otherwise allow light from the light sources described herein to reach the external surface 113 and display an illuminated symbol or glyph within the input region 116.

Figure 9A:
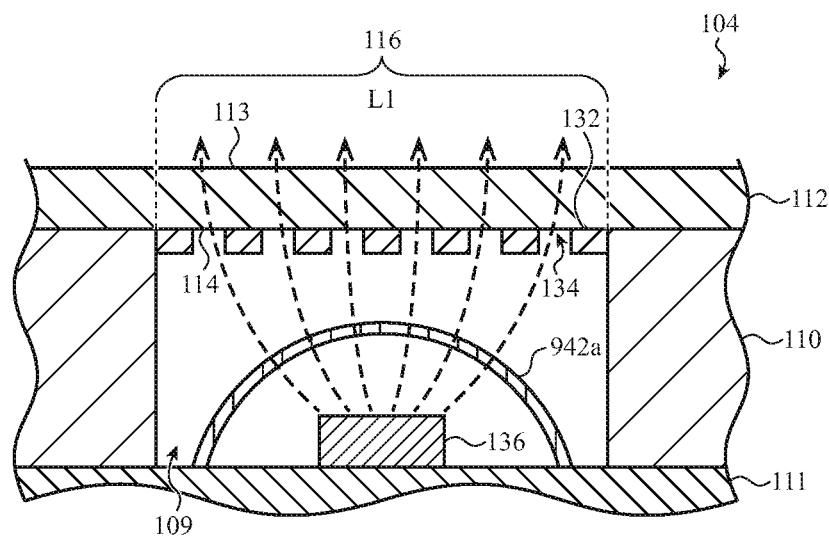
FIG. 9A depicts a cross-sectional view of the input region of FIG. 1A having an tactile dome switch, taken along line A-A of FIG. 1A.

With reference to FIG. 9A, the electronic device 104 is shown as having a tactile dome 942*a*. The tactile dome 942*a* may be configured to buckle in response to an applied force. The tactile dome 942*a* may be positioned within the interior volume 109 below the enclosure wall 112 and the opaque masking layer 132. In some cases, a top surface of the tactile dome 942*a* may contact or abut the opaque masking layer 132, in other instances the opaque masking layer 132 and the tactile dome 942*a* may be separated by a gap. The enclosure wall 112 may receive a force input that causes the enclosure wall 112 to bend or deform within the input region 116. This bending or deformation of the enclosure wall 112 may cause the enclosure wall 112 to impact the tactile dome 942*a*. When the bending or deformation exceeds a threshold amount, the tactile dome 942*a* may buckle or collapse. For example, the tactile dome 942*a* may be formed from rubber, metal, and/or other material that exhibits elastically deformable characteristics in response to an applied force. This may deliver a tactile output to the input region 116. In some cases, the collapsing or buckling of the tactile dome 942*a* may trigger a switch event. For example, the tactile dome 942*a* may contact one or more electrical contacts (not shown in FIG. 9A) in response to a force input received by the enclosure wall 112 and trigger a switch event. As shown in FIG. 9A, the tactile dome 942*a* may surround the light source 136. In this regard, the tactile dome 942*a* may be a transparent structure, perforated structure, or other structure that allows light from the light source 136 to propagate toward the external surface 113.

Figure 9B:
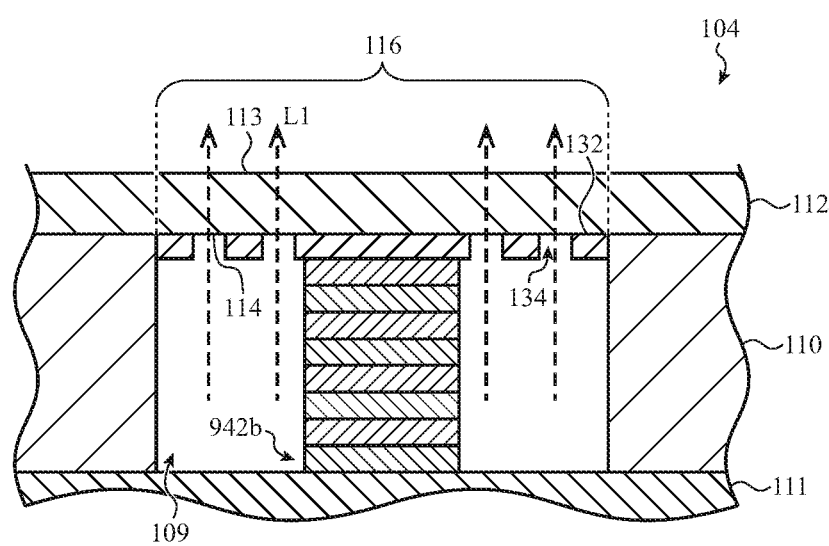
FIG. 9B depicts a cross-sectional view of the input region of FIG. 1A having an electroactive polymer stack, taken along line A-A of FIG. 1A.

With reference to FIG. 9B, the electronic device 104 is shown as having an electroactive polymer (EAP) or piezoelectric stack, such as stack 942*b*. The stack 942*b* may be positioned within the internal volume 109 and extend between an internal support 111 and the opaque masking layer 132 and/or the enclosure wall 112. Broadly, the stack 942b may be an alternating series of structures that expand and/or contract in response to a signal. For example, the stack 942b may be an alternating series of electrodes separated by compliant members; in response to a signal, the electrodes may move relative to one another and subsequently expand and/or contract one or more of the compliant members. This expansion and/or contraction may cause the enclosure wall 112 to translate or bend within the input region 116. Additionally or alternatively, the stack 942b may be an alternating series of piezoelectric material or strips that are arranged in a stack and configured to deflect or deform in response to a signal. The stack 942b may also be used to trigger a switch event. For example, the alternating series of electrodes and/or piezoelectric strips may exhibit a change in an electrical property (e.g., voltage, current, and so on) in response to a strain or compression, which may be used to estimate a force input received within the input region 116.

Figure 9C:
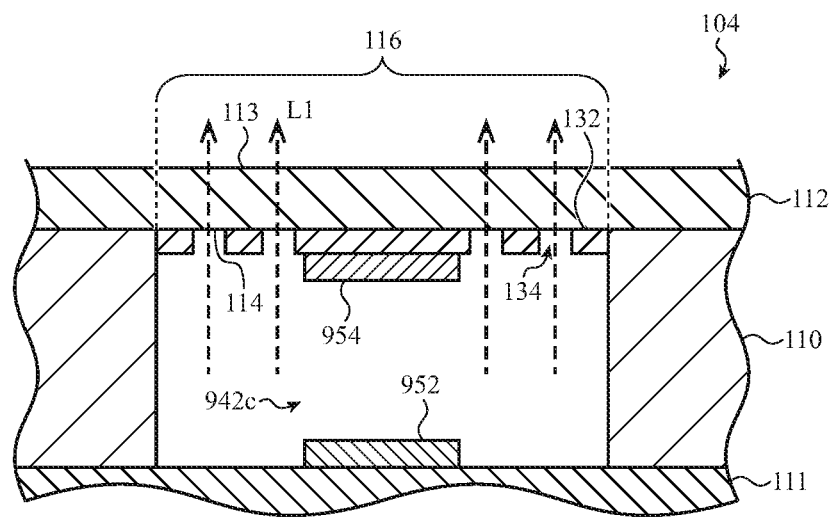
FIG. 9C depicts a cross-sectional view of the input region of FIG. 1A having a magnetic actuator, taken along line A-A of FIG. 1A.

With reference to FIG. 9C, the electronic device 104 is shown having a magnetic-based sensor 942c. The magnetic-based sensor 942c may be an electromagnet or other device that uses variations in a magnetic field to deliver a haptic output and/or trigger a switch event. In one embodiment, the magnetic-based sensor 942c may include a first biasing element 952 positioned on the internal support 111 and a second biasing element 954 positioned on or below the opaque masking layer 132 and/or the enclosure wall 112. The magnetic-based sensor 942c may detect variations in a magnetic field between the first and second biasing elements 952 and 954. This may be used to trigger a switch event. For example, the enclosure wall 112 may deform or partially bend into the interior volume 109 in response to a force input within the input region 116. This may cause a separation between the first and second biasing elements 952 and 954 to change. This change can be correlated with the bending of the enclosure wall 112 to estimate the force input received within the input region 116. The magnetic-based sensor 942c may also be used to deliver a haptic output to the input region 116. For example, the first and second biasing elements 952 and 954 may be configured to move relative to one another in response to an input signal. Such relative movement of the first and second biasing elements 952 and 954 may cause the enclosure wall 112 to temporarily vibrate or displace within the input region 116 and thus create a tactile output, for example, in response to an input. In some cases, the first and second biasing elements 952 and 954 may be components of a voice coil or reluctance actuator.

Figure 9D:
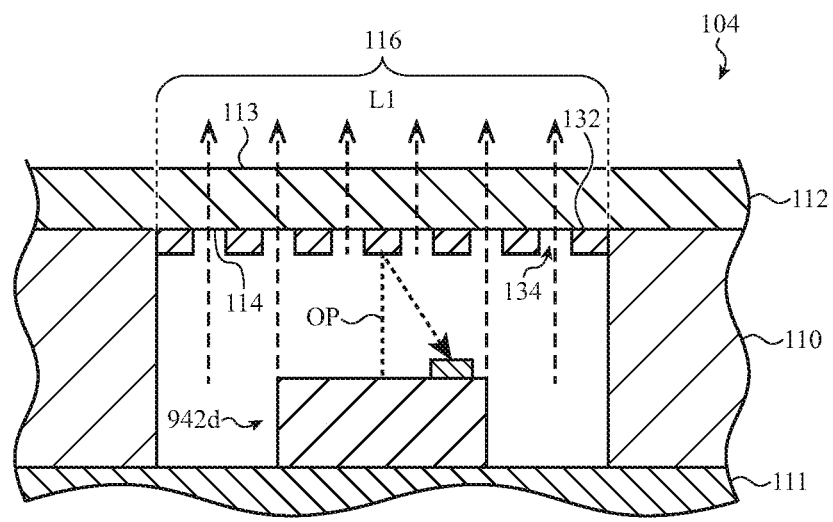
FIG. 9D depicts a cross-sectional view of the input region of FIG. 1A having an optical sensor, taken along line A-A of FIG. 1A.

With reference to FIG. 9D, the electronic device 104 is shown as having an optical sensor 942d. The optical sensor 942d may emit a signal along optical path OP that extends toward the opaque masking layer 132 and/or the enclosure wall 112. The optical sensor 942d may detect the reflection or propagation of the emitted signal along the optical path OP to estimate movement of the enclosure wall 112. For example, movements of the enclosure wall 112 may alter the distance of the optical path OP, which may be detectable by the optical sensor 942d. As described herein, the enclosure wall 112 may bend or deflect at least partially into the interior volume 109 in response to a force input. As such, the optical sensor 942d may correlate the altered optical path OP with the bending of the enclosure wall 112 to estimate a force input received within the input region 116.

Figure 9E:
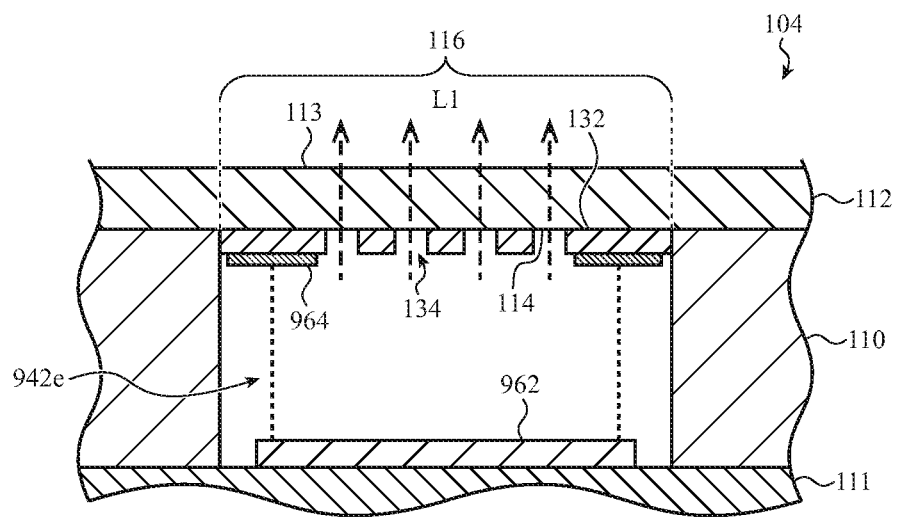
FIG. 9E depicts a cross-sectional view of the input region of FIG. 1A having a capacitive-based sensor, taken along line A-A of FIG. 1A.

With reference to FIG. 9E, the electronic device 104 is shown as having a capacitance-based sensor 942e. The capacitance-based sensor 942e uses variations in capacitance to detect an input within the input region 116. In one embodiment, the capacitance-based sensor 942e may include a first capacitive element 962 positioned on the internal support 111 and a second capacitive element 964 positioned on or below the opaque masking layer 132 and/or the enclosure wall 112. The second capacitive element 964 may include openings similar to the array of microperforations 134 such that light may pass through the second capacitive element 964 and exit the internal volume of the electronic device 104. The capacitance-based sensor 942e may detect variations in capacitance between the first and second capacitive elements 962, 964. This may be used to trigger a switch event. For example, the enclosure wall 112 may deform or partially bend into the interior volume 109 in response to a force input within the input region 116. This may cause a separation between the first and second capacitive elements 962, 964 to change. This change can be correlated with the bending of the enclosure wall 112 to estimate the force input received within the input region 116. Additionally or alternatively, the capacitance-based sensor 942e may form a mutual or a self-capacitive configuration, in which capacitive elements of the actuator 942f may detect a touch input (contact) or proximity of a user relative to the enclosure wall 112. For example, the capacitance-based sensor 942e may estimate a touch input or proximity of a user by detect a change in capacitance measured at a capacitive element.

Figure 9F:
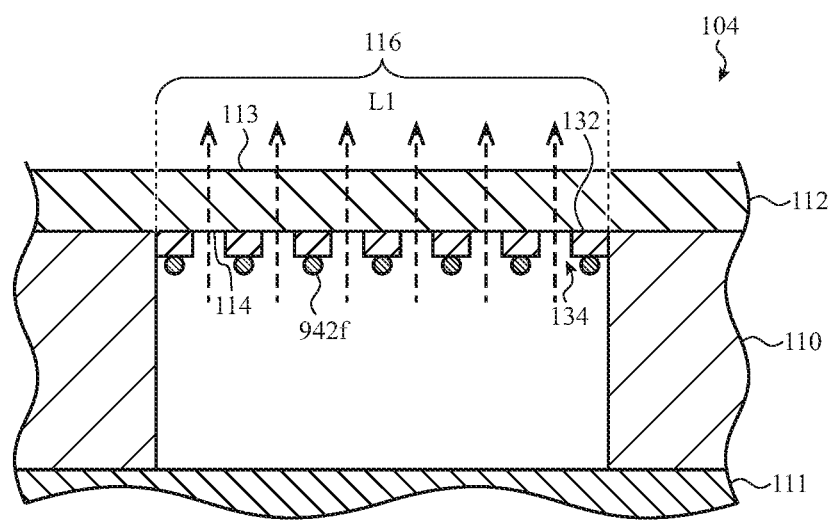
FIG. 9F depicts a cross-sectional view of the input region of FIG. 1A having an array of shape memory alloy wires, taken along line A-A of FIG. 1A.

With reference to FIG. 9F, the electronic device 104 is shown as having a shape-memory alloy ("SMA") component, such as SMA component 942f. The SMA component 942f may be wires or other metal structure configured to deform in a predetermined manner in response to a temperature change. The SMA component 942f may be positioned within the interior volume 109 and below the opaque masking layer 132 and/or the enclosure wall 112. The SMA component 942f may be used to deliver a haptic effect to the enclosure wall 112 within the input region 116. To illustrate, the SMA component 942f may be configured to return to an original shape (from a deformed state) in response to heat. As such, applying heat to the SMA component 942f may cause the SMA component 942f to exert a force on the enclosure wall 112 as the SMA component 942f attempts to return to an original shape. This may cause movement of the enclosure wall 112 and thus provide a haptic or tactile output that is perceptible to the user.

Figure 9G:
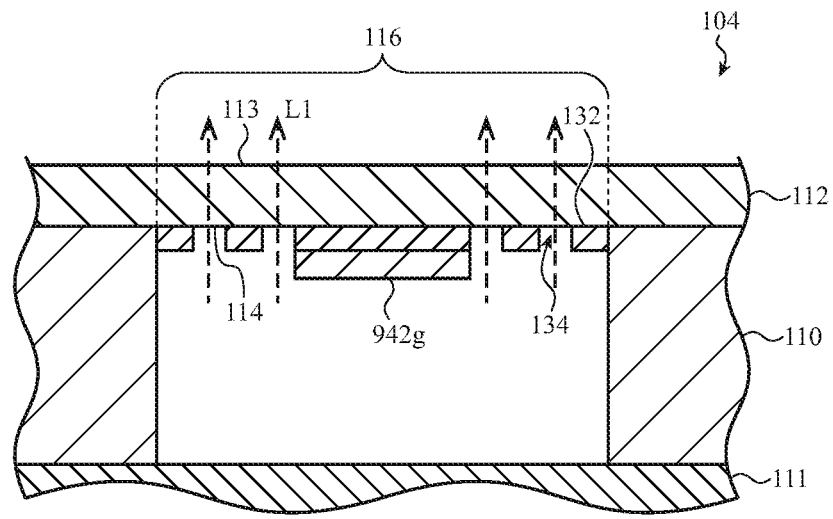
FIG. 9G depicts a cross-sectional view of the input region of FIG. 1A having a strain gauge, taken along line A-A of FIG. 1A.

With reference to FIG. 9G, the electronic device 104 is shown as having a strain gauge 942g. The strain gauge 942g may be positioned within the interior volume 109 and below the opaque masking layer 132 and/or the enclosure wall 112. The strain gauge 942g may be used to deliver a haptic output to the enclosure wall 112. In one implementation, the strain gauge 942g may be formed from a piezoelectric material and positioned directly on, or adjacent to, a portion of the opaque masking layer 132 and/or the enclosure wall 112. In an implementation, a voltage may be applied across the piezoelectric material causing the piezoelectric material to grow and/or shrink in length. To the extent that the piezoelectric material is inhibited from moving, the change in length of the piezoelectric material may cause a momentary bending or depression of the enclosure wall 112. The momentary bending or depression formed within the enclosure wall 112 may be tactilely perceivable by a user and thus deliver haptic feedback to the user. Additionally or alternatively, the strain gauge 942g may be used to measure a force input received at the enclosure wall 112 within the input region 116. For example, a force input received within the input region 116 may cause bending or deflection of the enclosure wall 112 into the interior volume and subsequently cause the strain gauge 942g to deform. The strain gauge 942g may be configured to produce an electrical response in response to deformation, which may be used by the electronic device 104 to trigger a switch event.

Figure 9H:
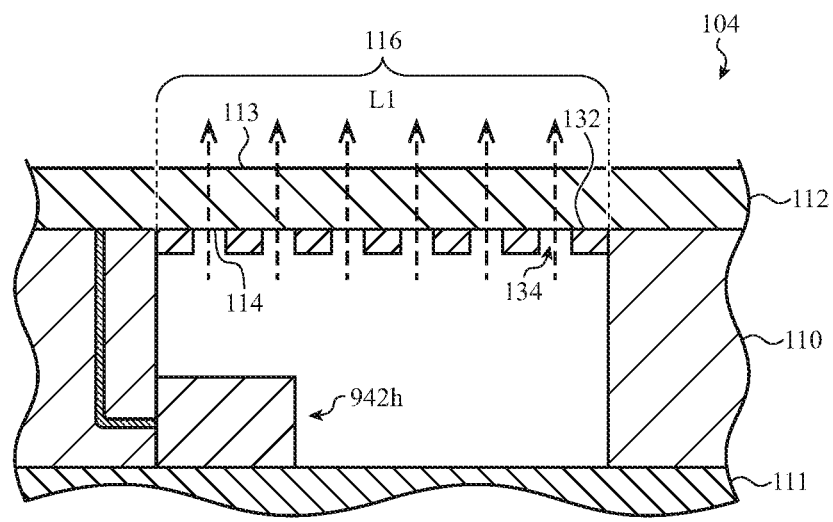
FIG. 9H depicts a cross-sectional view of the input region of FIG. 1A having an electrostatic feedback structure, taken along line A-A of FIG. 1A.

With reference to FIG. 9H, the electronic device 104 is shown as having an electrostatic feedback assembly 942h. The electrostatic feedback assembly 942h may be positioned within the interior volume 109 and below the opaque masking layer 132 and/or the enclosure wall 112. Broadly, the electrostatic feedback assembly 942h may be configured to electrically charge the external surface 113 of the enclosure wall 112. A user may tactilely perceive the electrical charge on the external surface 113. For example, the electrical charge may be perceived as a resistance or impediment to movement across the external surface 113. This may be beneficial for providing a tactile output indicative of or resembling a physical button or key defined on the external surface 113. In one embodiment, the electronic device 104 may display indicia indicative of a slider knob or control on the external surface 113 and the electrostatic feedback assembly 942h may be configured to generate a tactile output indicate of operating a physical knob or slider control.

Figure 9I:
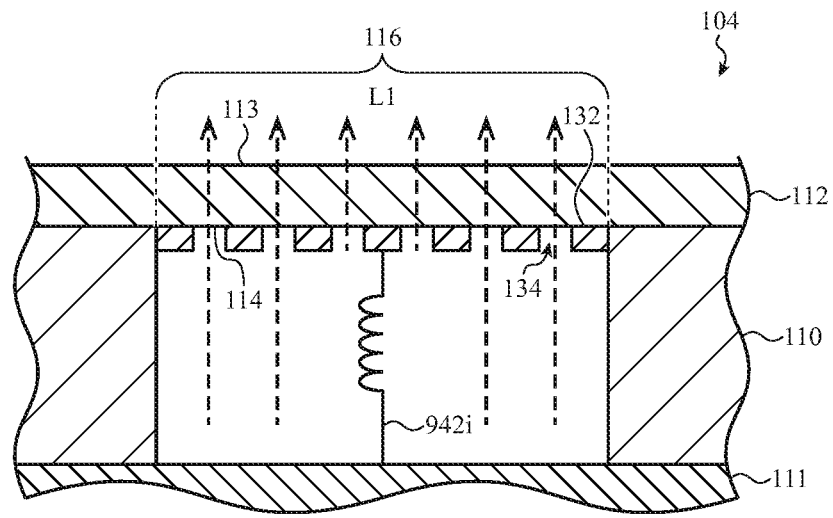
FIG. 9I depicts a cross-sectional view of the input region of FIG. 1A having a biasing element, taken along line A-A of FIG. 1A.

With reference to FIG. 9I, the electronic device 104 is shown as having a mechanical spring 942i. The mechanical spring 942d may be a mechanical biasing element that provides tactile feedback to the enclosure wall 112. The mechanical spring 942i may extend between the internal support 111 and the opaque masking layer 132 and/or the enclosure wall 112. The mechanical spring 942i may exert a compressive force on the enclosure wall 112 that may increase corresponding with the bending or deflection of the enclosure wall 112 within the input region 116. In some embodiments, the mechanical spring 942i may be coupled with a contact or non-contact-based sensing element that may be used to trigger a switch event in response to an input within the input region 116.

Figure 9J:
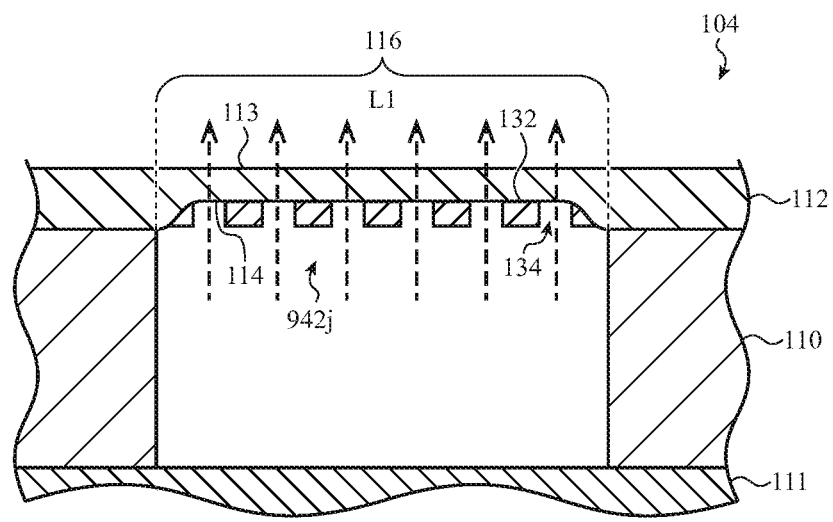
FIG. 9J depicts a cross-sectional view of the input region of FIG. 1A having a translucent layer with a thinned region, taken along line A-A of FIG. 1A.

With reference to FIG. 9J, the electronic device 104 is shown as having a thinned region 942j. The thinned region 942j may be a physical structure that is formed into the enclosure wall 112. As illustrated in FIG. 9J, the thinned region 942j may be a portion of the enclosure wall 112 having a reduced thickness. The thinned region of the enclosure wall 112 may exhibit a district tactile response as compared within other, non-thinned regions, of the enclosure wall 112. This may be used to indicate the presence or boundary of the input region 116 to a user. The opaque masking layer 132 and/or other components of the electronic device 104 may be positioned within the thinned region, for example, as shown in FIG. 9J.

FIGS. 10A-13C depict various electronic devices having a hidden or concealable input region. Broadly, the input region may be formed on any external surface of an electronic device. This may be a device enclosure, case, cover, panel, display masking area, or other surface of an electronic device. In an unilluminated state, the input region may resemble a surface of the electronic device having no input functionality. For example, as described herein, an opaque masking layer having an array of microperforations may be positioned below an enclosure wall that forms an exterior surface of the electronic device. The enclosure wall may be formed from or include a translucent layer and/or a metal layer. The array of microperforations may be visually imperceptible when unilluminated, and thus may be used to hide or conceal the input functionality from a user. The electronic device may subsequently illuminate the array of microperforations to reveal the input functionality of the input region. In some cases, one or more sensing elements, haptic structures, or the like may be positioned below the input region and used to detect an input within the input region and/or deliver a haptic response.

Figure 10A:
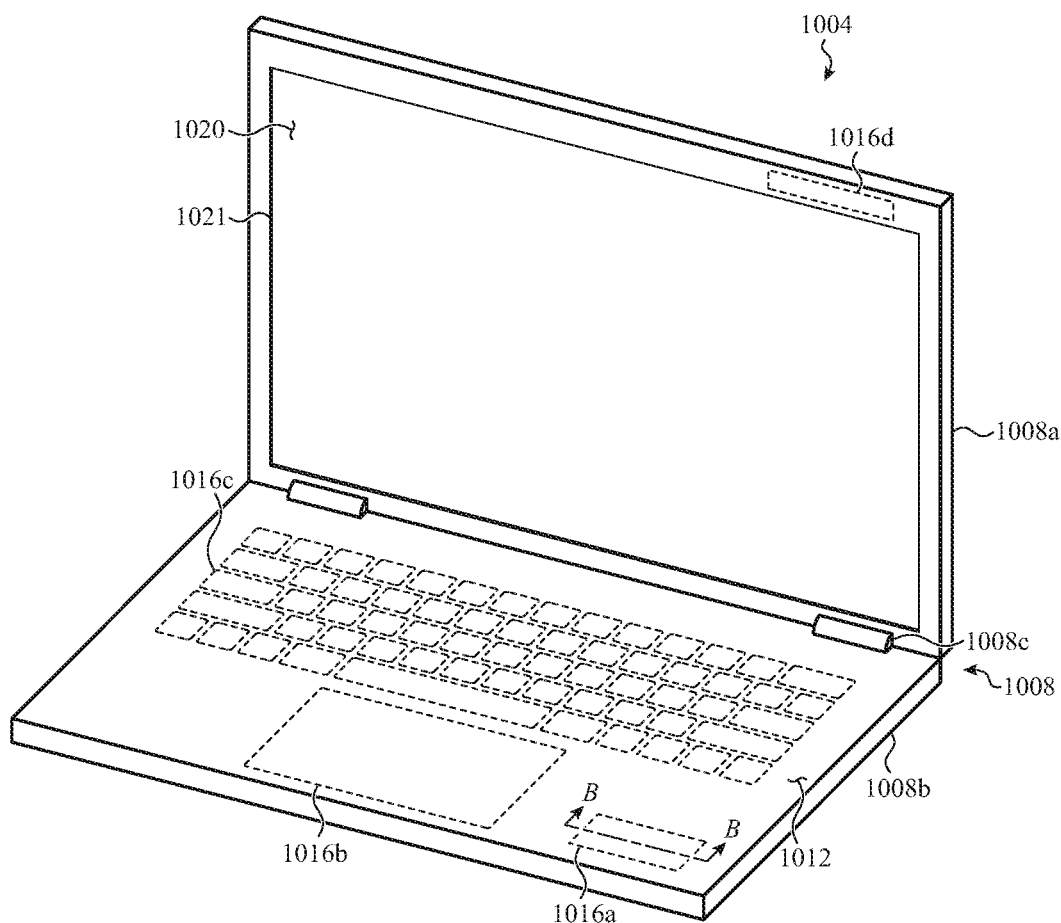
FIG. 10A depicts a sample notebook computer having multiple input regions.

FIG. 10A depicts an electronic device 1004. The electronic device 1004 may be a notebook computer. For purposes of illustration, the electronic device 1004 is shown as having an enclosure 1008, a display 1020, and a translucent layer 1012. It should be noted that the electronic device 1004 may also include various other components, such as one or more ports (e.g., charging ports, data transfer ports, or the like), additional input/output buttons, and so on. As such, the discussion of any electronic device, such as electronic device 1004, is meant as illustrative only.

The enclosure 1108 may include various components that cooperate to form the notebook computer. As shown in FIG. 10A, the enclosure 1008 may include a upper portion 1008a and a lower portion 1008b. The first and second portions 1008a, 1008b may be pivotally coupled to one another about a hinge 1008c. The upper portion 1008a may include or define an opening. The display 1020 may be positioned within the opening. The lower portion 1008b may include or be partially formed from the enclosure wall 112. In this regard, a hidden or concealable input region may be defined on an exterior surface of the lower portion 1008b. In some cases, the upper portion 1008a may also include a translucent layer or translucent outer surface. This may allow the electronic device 1004 to define a hidden or concealable input region on a portion of the upper portion 1008a.

The electronic device 1004 may include multiple areas that may be defined on one or more surfaces of the enclosure 1008. As shown in FIG. 10A, the electronic device 1004 includes input region 1016a, input region 1016b, input region 1016c, and input region 1016d. The input regions 1016a, 1016b, 1016c, 1016d may be substantially hidden or concealed from a user when not illuminated. When illuminated, the hidden input functionality of the input regions 1016a, 1016b, 1016c, 1016d may be revealed and used to control a function of the electronic device 1004. The input regions 1016a, 1016b, 1016c, 1016d may be positioned or arranged across various surfaces formed by the enclosure 1008. As shown in FIG. 10A, the input regions 1016a, 1016b, and 1016c may be positioned on an external surface of the electronic device 1004 defined by the lower portion 1008b and the input region 1016d may be positioned on an external surface of the electronic device 1004 defined by the upper portion 1008a. As described in greater detail below with respect to FIG. 10C, distinct symbols may be illuminated on or within the input regions 1016a, 1016b, 1016c, 1016d, including functions and/or notifications relating to a power button, a trackpad, a keyboard, and/or email or message-related function. In some cases, the input regions 1016a, 1016b, 1016c, 1016d may be configured to receive input that is used to control a function of the electronic device 1004 corresponding with the illuminated symbol.

Figure 10B:
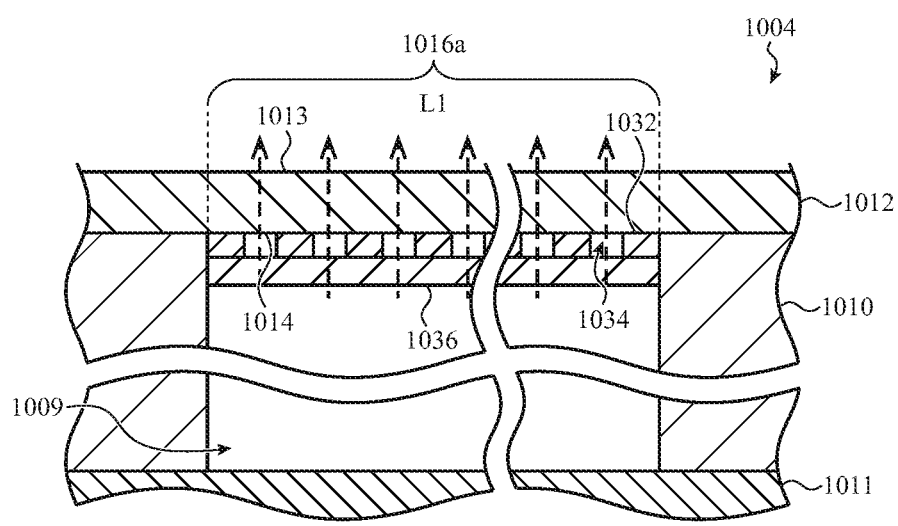
FIG. 10B depicts a cross-sectional view of the input region of FIG. 10A, taken along line B-B of FIG. 10A.

FIG. 10B depicts a cross-sectional view of the input region of FIG. 10A, taken along line B-B of FIG. 10A. The input region 1016a may be substantially analogous to the input region 116 described above with respect to FIGS. 1A-9J. For example, the input region 1016a may be configured to display an illuminated symbol at the translucent layer 1012 and detect an input on the translucent layer 1012. In this regard, analogous to the components described with respect to the embodiments of FIGS. 1A-9J, the electronic device 1004 may include: translucent layer 1012; external surface 1013; underside surface 1014; interior volume 1009; support structure 1010; internal support 1011; opaque masking layer 1032; array of microperforations 1034; and light path L1. The electronic device 1004 may also include one or more actuators, sensing elements, haptic structures, or the like positioned within the interior volume 1009 and below the translucent layer 1112. This may be used to detect input within the input region 1016a and deliver a haptic effect to the translucent layer 1012.

Figure 10C:
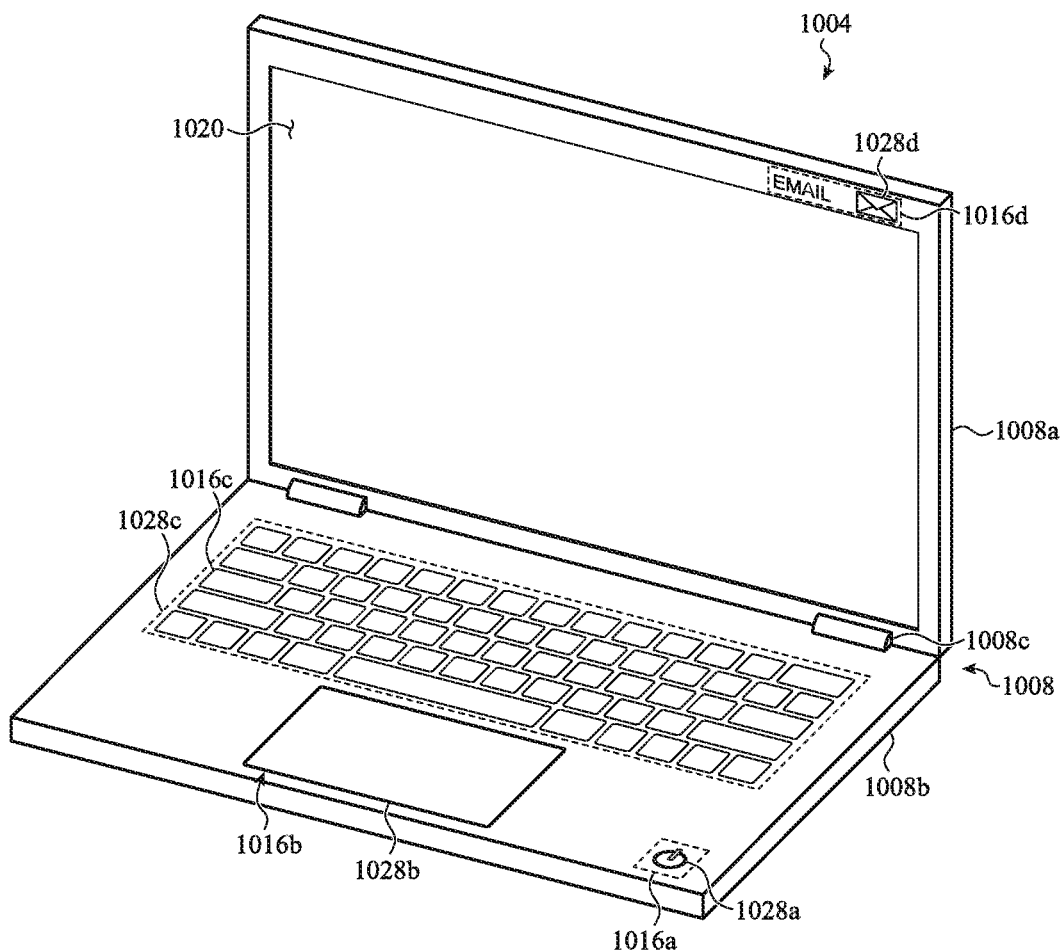
FIG. 10C depicts the sample notebook computer of FIG. 10A having multiple illuminated input regions.

FIG. 10C depicts the electronic device 1004 having the input regions 1016a, 1016b, 1016c, 1016d in an illuminated state. Each of the input regions 1016a, 1016b, 1016c, 1016d may display a unique illuminated symbol and/or be used to control a distinct function of the electronic device 1004. To illustrate, input region 1016a may include an illuminated symbol 1028a. The illuminated symbol 1028a may depict information relating to a power button. The input region 1016a may be configured to detect input that causes the electronic device 1004 to transition between various modes or states of power (e.g., on, off, sleep, and so on). In some cases, the illuminated symbol 1028a is dark or not visible until the device receives an input, which may include a touch input or force input along input region 1016a or along another input region, key, or button of the device.

The input region 1016b may include an illuminated symbol 1028b. The illuminated symbol 1028b may depict information relating the boundary of a trackpad. The input region 1016b may be configured to detect input that causes the electronic device 1004 to operate a cursor or other indicia depicted at display 1020 (e.g., such that the input region 1016b functions as a computer trackpad). The input region 1016c may include illuminated symbol 1028c. The illuminated symbol 1028c may depict information relating to one or more boundaries of keyboard keys. The input region 1016c may be configured to detect input that causes the electronic device 1004 to produce an output corresponding to a keyboard key (e.g., such that the input region 1016c functions as a computer keyboard). The input region 1016d may include an illuminated symbol 1028d. The illuminated symbol 1028d may depict information relating to an "email" notification or commend. The input region 1016d may be configured to detect input that causes the electronic device 1004 to access information associated with an email message.

In some implementations, the input regions 1016a, 1016b, 1016c, 1016d need not receive input or be used to control a function of the electronic device 1004; rather, the illuminated symbol may be indicative of a notification or status of the electronic device 1004. For example, the illuminated symbol 1028d may be indicative of a notification of an incoming email message and not be configured to receive input or associated with specific input functionality. In general, an illuminated symbol may be positioned along a surface of the device that is not configured to receive input and may be simply visual indicators that are selectively illuminable.

Each of the input regions 1016a, 1016b, 1016c, 1016d may be configured to manipulate a graphical out of the display 1020 in a distinct manner. For example, the input region 1016a may manipulate a graphical out of the display 1020 in a first manner when the illuminated symbol 1028a is depicted. This may include representing information at the display 1020 corresponding to, or based on, the illuminated symbol 1028a. Further, the input region 1016b may manipulate a graphical out of the display 1020 in a second manner when the illuminated symbol 1028b is depicted. This may include representing information at the display 1020 corresponding to, or based on, the illuminated symbol 1028b. Further, the input region 1016c may manipulate a graphical out of the display 1020 in a third manner when the illuminated symbol 1028c is depicted. This may include representing information at the display 1020 corresponding to, or based on, the illuminated symbol 1028c. Further, the input region 1016d may manipulate a graphical out of the display 1020 in a fourth manner when the illuminated symbol 1028d is depicted. This may include representing information at the display 1020 corresponding to, or based on, the illuminated symbol 1028d.

The electronic device 1004 may deliver haptic outputs to the input regions 1016a, 1016b, 1016c, 1016d. This may be used to simulate or resemble the tactile sensation of a mechanical or physical button. For example, the electronic device 1004 may cause a haptic structure positioned with the enclosure 1008 to vibrate, translate, or otherwise move the translucent layer 1112.

Figure 10D:
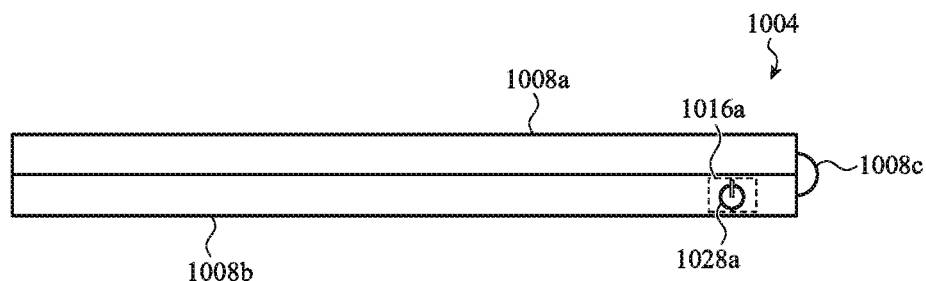
FIG. 10D depicts the sample notebook computer of FIG. 10A having an illuminated input region, according to another configuration.

FIG. 10D depicts a side view of the electronic device 1004 in a closed position. For example, the first and second portions 1008a, 1008b may pivot relative to one another about the hinge 1008c such that first and second portions 1008a, 1008b contact one another to define the closed position.

The input regions, described herein, may be operable to control a function of the electronic device 1004 when the electronic device 1004 is in the closed positioned depicted with respect to FIG. 10D. For example, an input region may be defined along an external surface of the enclosure 1008 that is accessible to a user when the electronic device 1004 is in the closed position. As shown in FIG. 10D, the input region 1016a may be defined on a side surface of the lower portion 1008b. For example, the translucent layer 1112 may be or form a sidewall of the lower portion 1008b. The input region 1016a defined on the sidewall may be configured to receive input that may be used to control a function of the electronic device 1004. This may be beneficial, for example, to control a power function of the electronic device 1004, as indicated with the illuminated symbol 1028a.

Figure 11A:
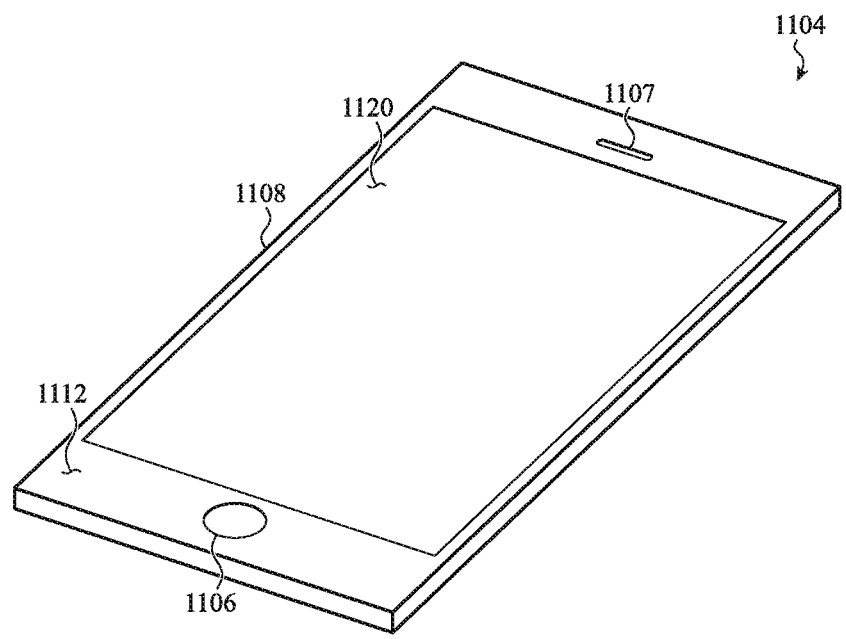
FIG. 11A depicts a sample portable electronic device.

FIG. 11A depicts an electronic device 1104. The electronic device 1104 may be a mobile phone. For purposes of illustration, the electronic device 1104 is shown as having an enclosure 1108, a display 1120, a translucent layer 1112, one or more input/output members 1106, and a speaker 1107. It should be noted that the electronic device 1104 may also include various other components, such as one or more ports (e.g., charging ports, data transfer ports, or the like), additional input/output buttons, and so on. As such, the discussion of any electronic device, such as electronic device 1104 is meant as illustrative only.

Figure 11B:
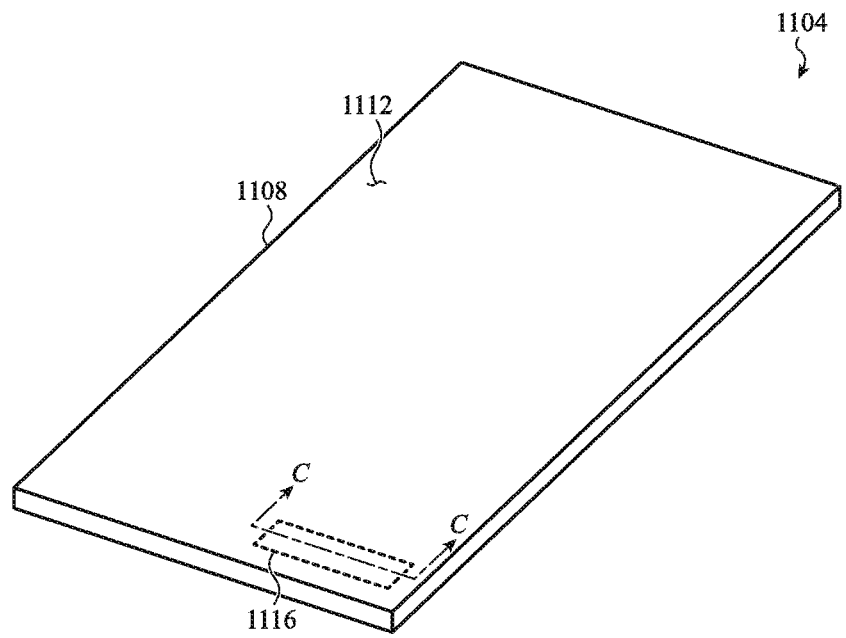
FIG. 11B depicts a rear surface of the sample portable electronic device of FIG. 11A having an input region.

FIG. 11B depicts a bottom surface of the enclosure 1108 of the electronic device 1104. The electronic device 1104 may include a translucent layer 1112 that forms the bottom surface of the enclosure 1108. As shown in FIG. 11B, the electronic device 1104 may include input region 1116. The input region 1116 may be substantially hidden or concealed from a user when not illuminated. When illuminated (as shown in FIG. 11D), the electronic device 1104 may reveal the hidden input functionality of the input region 1116. As described in greater detail below with respect to FIG. 11D, the input region 1116 may control various function and/or provide various notifications associated with the electronic device 1104.

Figure 11C:
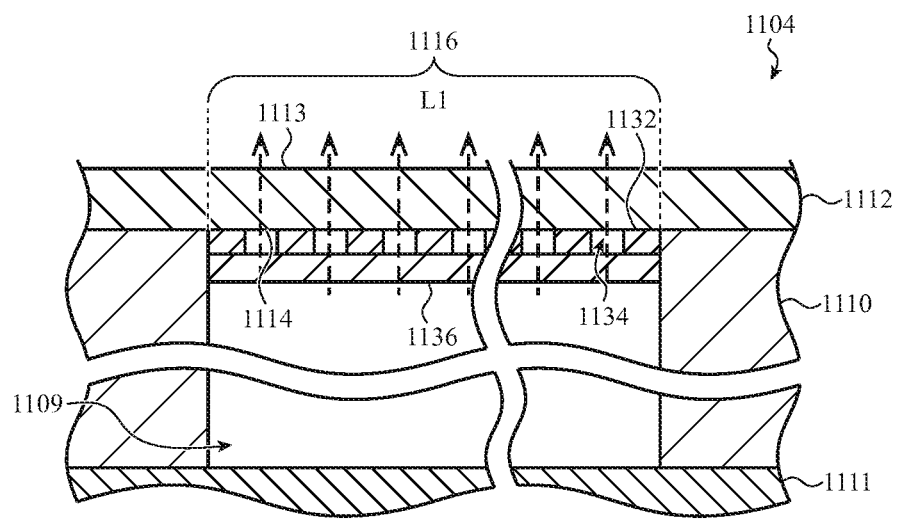
FIG. 11C depicts a cross-sectional view of the input region of FIG. 11B, taken along line C-C of FIG. 11B.
Figure 11D:
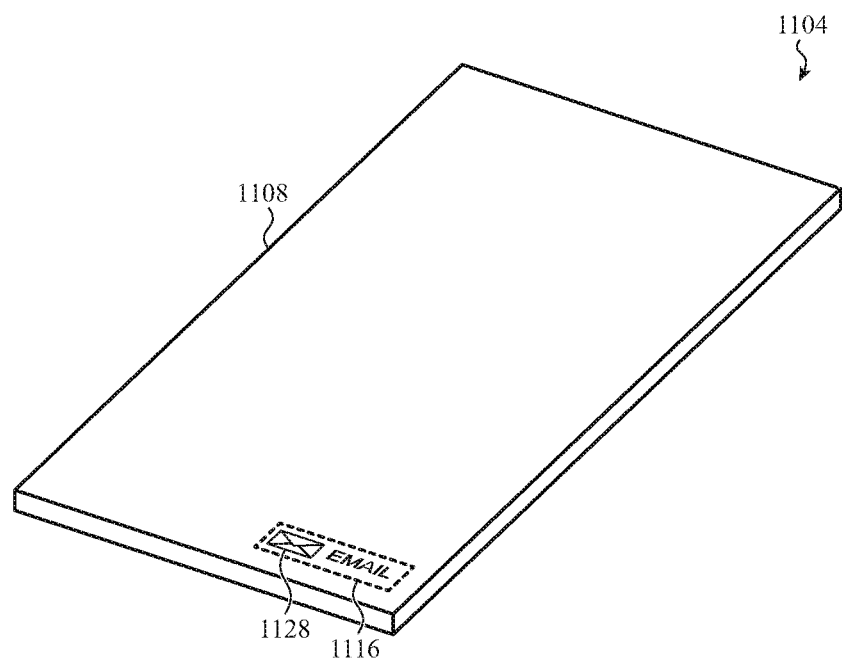
FIG. 11D depicts the sample portable electronic device of FIG. 11B having an illuminated input region.

FIG. 11C depicts a cross-sectional view of the input region of FIG. 11B, taken along line C-C of FIG. 11B. The input region 1116 may be substantially analogous to the input region 116 described above with respect to FIGS. 1A-9J. For example, the input region 1116a may be configured to display an illuminated symbol at the translucent layer 1112 and detect an input on the translucent layer 1112.

In this regard, analogous to the components described with respect to the embodiments of FIGS. 1A-9J, the electronic device 1104 may include: translucent layer 1112; external surface 1113; underside surface 1114; interior volume 1109; support structure 1110; internal support 1111; opaque masking layer 1132; array of microperforations 1134; and light path L1. The electronic device 1104 may also include one or more actuators, sensing elements, haptic structures, or the like positioned within the interior volume 1109 and below the translucent layer 1112. This may be used to detect input within the input region 1116 and deliver a haptic effect to the translucent layer 1112.

FIG. 11D depicts the electronic device 1104 having the input region 1116 in an illuminated state. The input region 1116 may display one more distinct illuminated symbols and/or be used to control various different functions of the electronic device 1104. To illustrate, the input region 1116 may include an illuminated symbol 1128. The illuminated symbol 1128 may depict information relating to an "email" notification or commend. The input region 1016 may be configured to detect input that causes the electronic device 1104 to access information associated with an email message. In some implementations, the input region 1116 need not be configured to receive input or be used to control a function of the electronic device 1104; rather, the illuminated symbol 1124 may simply be indicative of a notification or provide other visual information. For example, the illuminated symbol 1128 may be displayed along an exterior surface of a device that is not configured to receive input or provide specific input functionality associated with the illuminated symbol 1128. The electronic device 1104 may deliver haptic outputs to the input region 1116. This may be used to simulate or resemble the tactile sensation of a mechanical or physical button. For example, the electronic device 1104 may cause a haptic structure positioned within the enclosure 1108 to vibrate, translate, or otherwise provide haptic feedback to the translucent layer 1112.

Figure 12A:
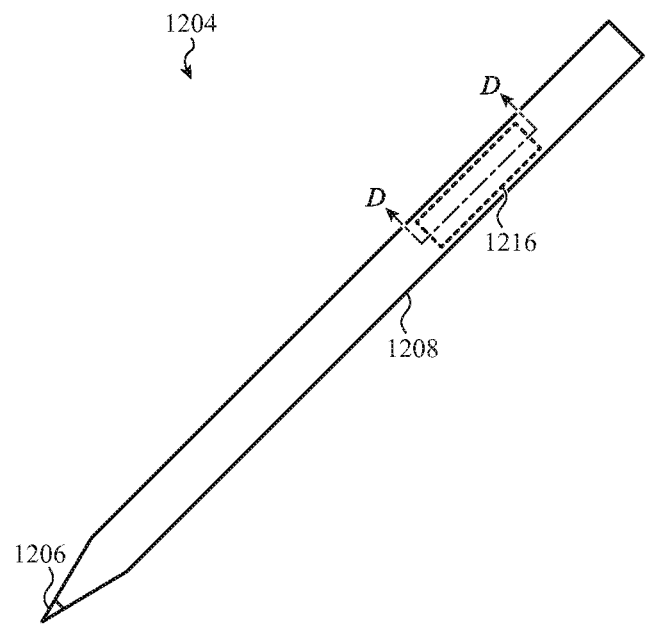
FIG. 12A depicts a sample stylus having an input region.

FIG. 12A depicts an electronic device 1204. The electronic device 1204 may be a stylus. The stylus may be used to provide input to an associated electronic device, such as a tablet or smart phone, for example, through interaction with a touch-sensitive surface of the associated electronic device. For purposes of illustration, the electronic device 1204 is shown as having a body 1208 and a tip 1206. A user many manipulate the body 1208 to provide information to the associated electronic device, for example, by moving the tip 1206 relative to a touch-sensitive surface of the associated electronic device. It should be noted that the electronic device 1204 may also include various other components, such as one or more ports (e.g., charging ports, data transfer ports, or the like), additional input/output buttons, and so on. As such, the discussion of any electronic device, such as electronic device 1204 is meant as illustrative only.

As shown in FIG. 12A, the electronic device 1204 may include input region 1216. The input region 1216 may be substantially hidden or concealed from a user when not illuminated. When illuminated (as shown in FIG. 12C), the electronic device 1204 may reveal the hidden input functionality of the input region 1216. As described in greater detail below with respect to FIG. 12C, the input region 1216 may control various function and/or provide various notifications associated with the electronic device 1204.

Figure 12B:
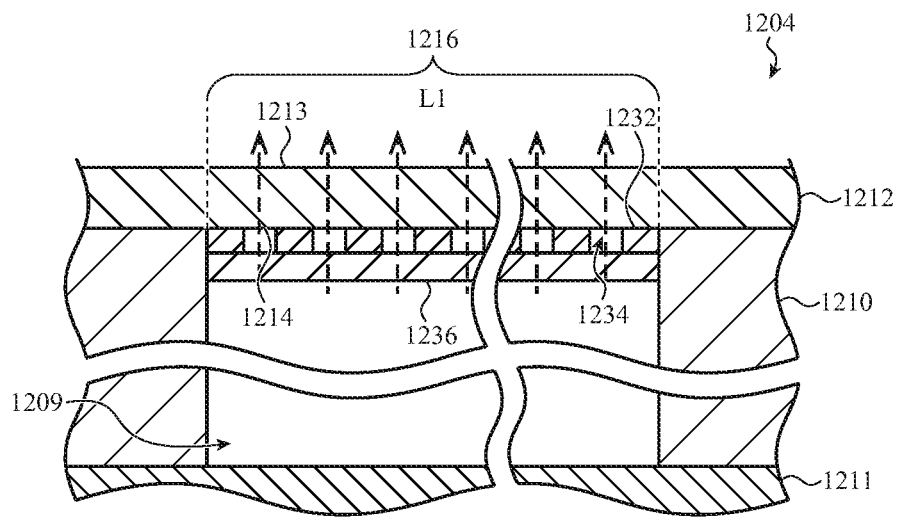
FIG. 12B depicts a cross-sectional view of the input region of FIG. 12A, taken along line D-D of FIG. 12A.
Figure 12C:
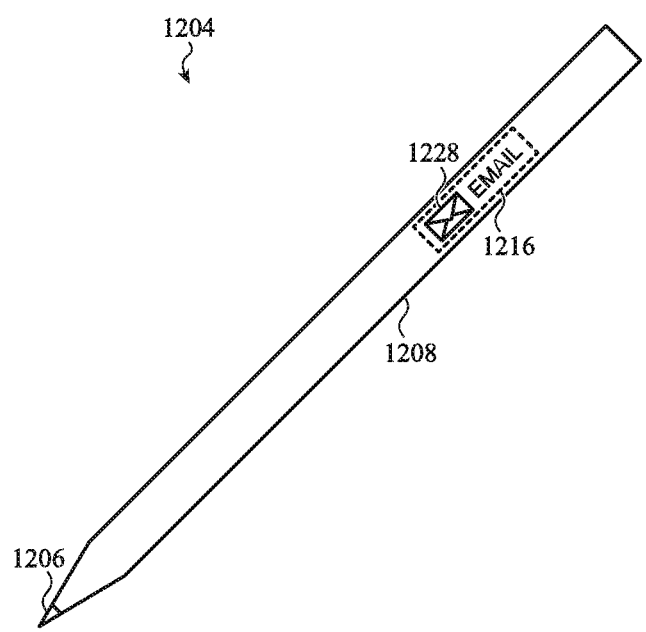
FIG. 12C depicts the sample stylus of FIG. 12A having an illuminated input region.

FIG. 12B depicts a cross-sectional view of the input region of FIG. 12A, taken along line D-D of FIG. 12A. The input region 1216a may be substantially analogous to the input region 116 described above with respect to FIGS. 1A-9J. For example, the input region 1216 may be configured to display an illuminated symbol at the translucent layer 1212 and detect an input on the translucent layer 1212. In this regard, analogous to the components described with respect to the embodiments of FIGS. 1A-9J, the electronic device 1204 may include: translucent layer 1212; external surface 1213; underside surface 1214; internal volume 1209; support structure 1210; internal support 1211; opaque masking layer 1232; array of microperforations 1234; and light path L1. The electronic device 1204 may also include one or more actuators, sensing elements, haptic structures, or the like positioned within the internal volume 1209 and below the translucent layer 1212. This may be used to detect input within the input region 1216 and deliver a haptic effect to the translucent layer 1212.

FIG. 12C depicts the electronic device 1204 having the input region 1216 in an illuminated state. The input region 1216 may display one or more distinct illuminated symbols and/or be used to control various different functions of the electronic device 1204. To illustrate, the input region 1216 may include an illuminated symbol 1228. The illuminated symbol 1228 may depict information relating to an "email" notification or command. The input region 1216 may be configured to detect input that causes the electronic device 1204 to access information associated with an email message. It will be appreciated, however, that the input region 1216 need not be configured to receive input or be used to control a function of the electronic device 1204; rather, the illuminated symbol 1228 may be indicative of a notification. For example, the illuminated symbol 1228, displayed along an exterior surface of the device, may be indicative of a notification of an incoming email message and the surface may not be configured to receive input or associated with a specific input functionality (e.g., the surface may be touch-sensitive but not configured to operate as a dedicated button or input region). The electronic device 1204 may deliver haptic outputs to the input region 1216. This may be used to simulate or resemble the tactile sensation of a mechanical or physical button. For example, the electronic device 1204 may cause a haptic structure positioned within the body 1208 to vibrate, translate, or otherwise provide haptic feedback to the translucent layer 1212.

Figure 13A:
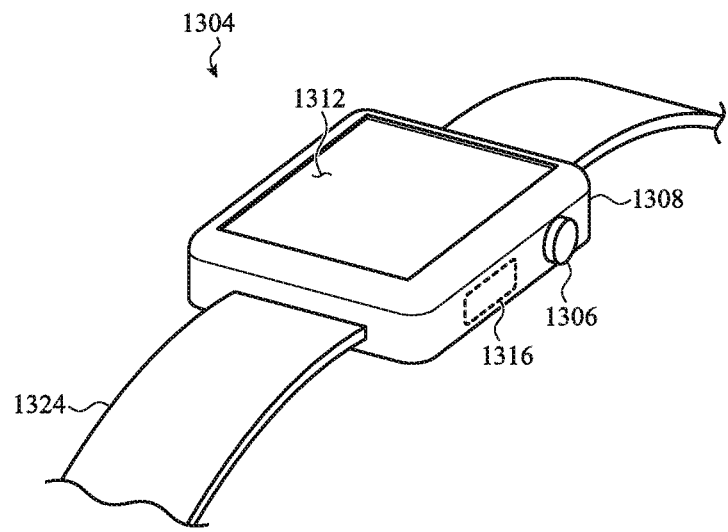
FIG. 13A depicts a sample watch having an input region.

FIG. 13A depicts an electronic device 1304. The electronic device 1304 may be a watch or other portable wearable electronic device. For purposes of illustration, the watch is shown as having a watch body 1308, a crown 1306, a display 1312, and a band 1324. The display 1312 may be positioned in a first opening defined by the enclosure 1308 and the crown 1306 may be at least partially positioned in a second opening defined by the enclosure 1308. The display 1312 may be responsive to translation and rotational movement of the crown 1306. For example, a graphical output of the display 1312 may be modified in a first manner in response to rotational movement of the crown 1306 and in a second manner in response to translational movement of the crown 1306. It should be noted that the electronic device 1304 may also include various other components, such as one or more ports (e.g., charging ports, data transfer ports, or the like), additional input/output buttons, and so on. As such, the discussion of any electronic device, such as electronic device 1304, is meant as illustrative only.

As shown in FIG. 13A, the electronic device 1304 may include input region 1316. The input region 1316 may be substantially hidden or concealed from a user when not illuminated. When illuminated (as shown in FIG. 13C), the electronic device 1304 may reveal the hidden input functionality of the input region 1316. As described in greater detail below with respect to FIG. 13C, the input region 1316 may control various functions and/or provide various notifications associated with the electronic device 1304.

Figure 13B:
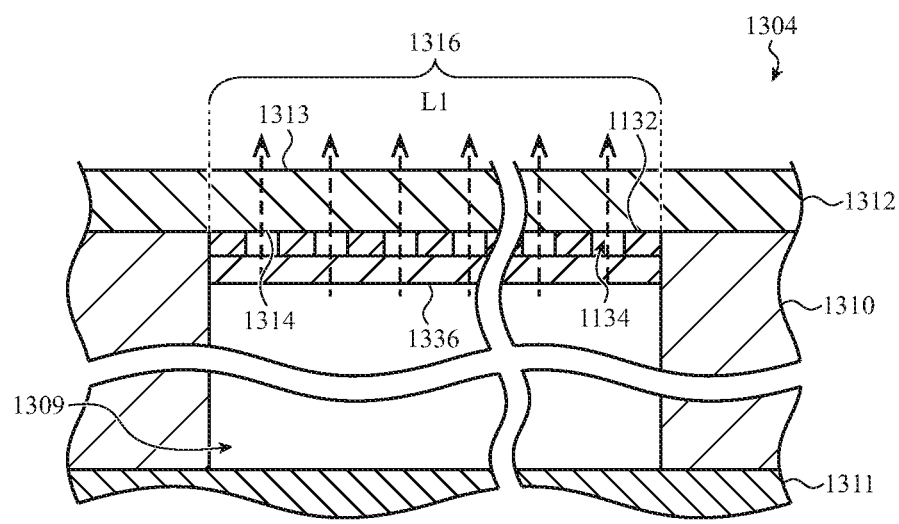
FIG. 13B depicts a cross-sectional view of the input region of FIG. 13A, taken along line E-E of FIG. 13A.
Figure 13C:
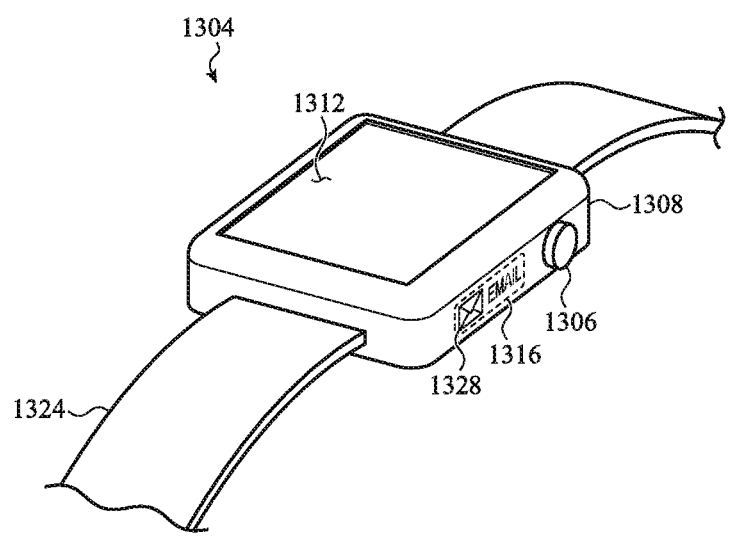
FIG. 13C depicts the sample watch of FIG. 13A having an illuminated input region.

FIG. 13B depicts a cross-sectional view of the input region of FIG. 13A, taken along line E-E of FIG. 13A. The input region 1316a may be substantially analogous to the input region 116 described above with respect to FIGS. 1A-9J. For example, the input region 1316 may be configured to display an illuminated symbol at the translucent layer 1312 and detect an input on the translucent layer 1312. In this regard, analogous to the components described with respect to the embodiments of FIGS. 1A-9J, the electronic device 1304 may include: translucent layer 1312; external surface 1313; underside surface 1314; internal volume 1309; support structure 1310; internal support 1311; opaque masking layer 1332; array of microperforations 1334; and light path L1. The electronic device 1304 may also include one or more actuators, sensing elements, haptic structures, or the like positioned within the internal volume 1309 and below the translucent layer 1312. This may be used to detect input within the input region 1316 and deliver a haptic effect to the translucent layer 1312.

FIG. 13C depicts the electronic device 1304 having the input region 1316 in an illuminated state. The input region 1316 may display one more distinct illuminated symbols and/or be used to control various different functions of the electronic device 1304. To illustrate, the input region 1316 may include an illuminated symbol 1328. The illuminated symbol 1328 may depict information relating to an "email" notification or command. The input region 1316 may be configured to detect input that causes the electronic device 1304 to access information associated with an email message. It will be appreciated, however, that the input region 1316 need not be configured to receive input or be used to control a function of the electronic device 1304; rather, the illuminated symbol 1328 may be indicative of a notification. For example, the illuminated symbol 1328 may be indicative of a notification of an incoming email message and may not be configured to receive input or associated with specific input functionality. The electronic device 1304 may deliver haptic outputs to the input region 1316. This may be used to simulate or resemble the tactile sensation of a mechanical or physical button. For example, the electronic device 1304 may cause a haptic structure positioned within the body 1308 to vibrate, translate, or otherwise provide haptic feedback to the translucent layer 1312.

Figure 14:
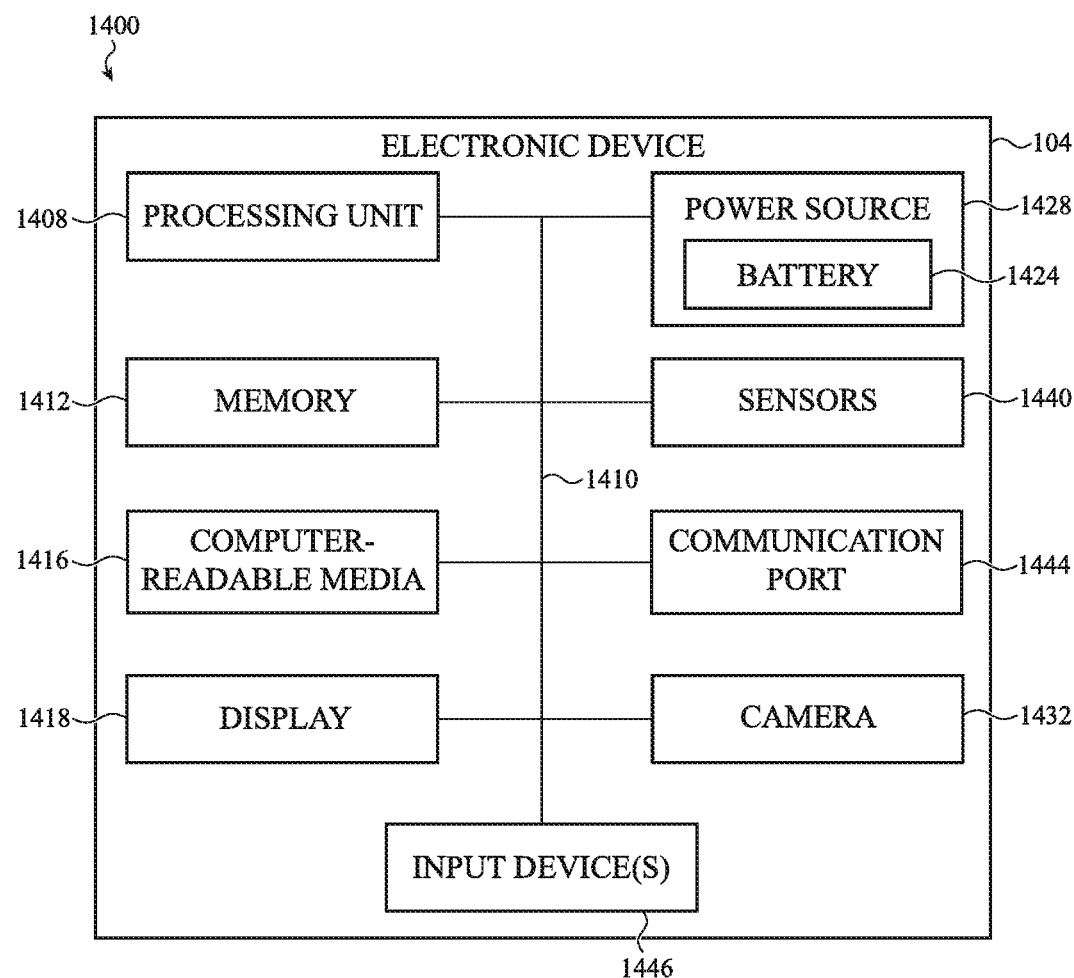
FIG. 14 illustrates a functional block diagram of an electronic device.

FIG. 14 presents a functional block diagram 1400 of a sample electronic device, such as the electronic device 104 described with respect to FIGS. 1A-9J. It will be appreciated, however, that the functional block diagram described herein of electronic device 104 may include components substantially analogous to components of other electronic devices or the like described herein. In this regard, the schematic representation in FIG. 14 may correspond to the electronic device depicted in FIGS. 1A-9J, described above. However, the schematic representation in FIG. 14 may also correspond to the other electronic devices or the like described herein, for example, such as electronic devices 1004, 1104, and/or 1204, described with respect to FIGS. 10A-13C. The electronic device 104 may include any appropriate hardware (e.g., computing devices, data centers, switches), software (e.g., applications, system programs, engines), network components (e.g., communication paths, interfaces, routers), and the like (not necessarily shown in the interest of clarity) for use in facilitating any appropriate operations disclosed herein.

As shown in FIG. 14, the electronic device 104 may include a processing unit or element 1408 operatively connected to computer memory 1412 and computer-readable media 1416. The processing unit 1408 may be operatively connected to the memory 1412 and computer-readable media 1416 components via an electronic bus or bridge (e.g., such as system bus 1410). The processing unit 1408 may include one or more computer processors or microcontrollers that are configured to perform operations in response to computer-readable instructions. The processing unit 1408 may be a central processing unit of the stylus. Additionally or alternatively, the processing unit 1408 may be other processors within the device including application specific integrated chips (ASIC) and other microcontroller devices.

The memory 1412 may include a variety of types of non-transitory computer-readable storage media, including, for example, read access memory (RAM), read-only memory (ROM), erasable programmable memory (e.g., EPROM and EEPROM), or flash memory. The memory 1412 is configured to store computer-readable instructions, sensor values, and other persistent software elements. Computer-readable media 1416 may also include a variety of types of non-transitory computer-readable storage media, including, for example, a hard-drive storage device, a solid state storage device, a portable magnetic storage device, or other similar device. The computer-readable media 1416 may also be configured to store computer-readable instructions, sensor values, and other persistent software elements.

In this example, the processing unit 1408 is operable to read computer-readable instructions stored on the memory 1412 and/or computer-readable media 1416. The computer-readable instructions may adapt the processing unit 1408 to perform the operations or functions described above with respect to FIGS. 1A-13C. The computer-readable instructions may be provided as a computer-program product, software application, or the like. It should be appreciated that, where the electronic device is a stylus, the processing unit 1408 may be located in an electronic device associated with the stylus, rather than the stylus itself. In such embodiments, data may be transmitted from the stylus to and from the electronic device, such that the processing unit in the electronic device may operatively control the stylus.

As shown in FIG. 14, the electronic device 104 may also include a display 1418. The display 1418 may include a liquid-crystal display (LCD), organic light emitting diode (OLED) display, light emitting diode (LED) display, or the like. If the display 1418 is an LCD, the display may also include a backlight component that can be controlled to provide variable levels of display brightness. If the display 1418 is an OLED or LED type display, the brightness of the display 1418 may be controlled by modifying the electrical signals that are provided to display elements.

The electronic device 104 may also include a battery 1424 that is configured to provide electrical power to the components of the electronic device 104. The battery 1424 may include one or more power storage cells that are linked together to provide an internal supply of electrical power. In this regard, the battery 1424 may be a component of a power source 1428 (e.g., including a charging system or other circuitry that supplies electrical power to components of the electronic device 104). The battery 1424 may be operatively coupled to power management circuitry that is configured to provide appropriate voltage and power levels for individual components or groups of components within the electronic device 104. The battery 1424, via power management circuitry, may be configured to receive power from an external source, such as an AC power outlet or interconnected computing device. The battery 1424 may store received power so that the electronic device 104 may operate without connection to an external power source for an extended period of time, which may range from several hours to several days.

The electronic device 104 may also include one or more sensors 1440 that may be used to detect a touch and/or force input, environmental condition, orientation, position, or some other aspect of the electronic device 104. For example, sensors 1440 that may be included in the electronic device 104 may include, without limitation, one or more accelerometers, gyrometers, inclinometers, goniometers, or magnetometers. The sensors 1440 may also include one or more proximity sensors, such as a magnetic hall-effect sensor, inductive sensor, capacitive sensor, continuity sensor, or the like.

The sensors 1440 may also be broadly defined to include wireless positioning devices including, without limitation, global positioning system (GPS) circuitry, Wi-Fi circuitry, cellular communication circuitry, and the like. The electronic device 104 may also include one or more optical sensors, including, without limitation, photodetectors, photosensors, image sensors, infrared sensors, or the like. In one example, the sensor 1440 may be an image sensor that detects a degree to which an ambient image matches a stored image. As such, the sensor 1440 may be used to identify a user of the electronic device 104. The sensors 1440 may also include one or more acoustic elements, such as a microphone used alone or in combination with a speaker element. The sensors 1440 may also include a temperature sensor, barometer, pressure sensor, altimeter, moisture sensor or other similar environmental sensor. The sensors 1440 may also include a light sensor that detects an ambient light condition of the electronic device 104.

The sensor 1440, either alone or in combination, may generally be a motion sensor that is configured to estimate an orientation, position, and/or movement of the electronic device 104. For example, the sensor 1440 may include one or more motion sensors, including, for example, one or more accelerometers, gyrometers, magnetometers, optical sensors, or the like to detect motion. The sensors 1440 may also be configured to estimate one or more environmental conditions, such as temperature, air pressure, humidity, and so on. The sensors 1440, either alone or in combination with other input, may be configured to estimate a property of a supporting surface, including, without limitation, a material property, surface property, friction property, or the like.

The electronic device 104 may also include a camera 1432 that is configured to capture a digital image or other optical data. The camera 1432 may include a charge-coupled device, complementary metal oxide (CMOS) device, or other device configured to convert light into electrical signals. The camera 1432 may also include one or more light sources, such as a strobe, flash, or other light-emitting device. As discussed above, the camera 1432 may be generally categorized as a sensor for detecting optical conditions and/or objects in the proximity of the electronic device 104. However, the camera 1432 may also be used to create photorealistic images that may be stored in an electronic format, such as JPG, GIF, TIFF, PNG, raw image file, or other similar file types.

The electronic device 104 may also include a communication port 1444 that is configured to transmit and/or receive signals or electrical communication from an external or separate device. The communication port 1444 may be configured to couple to an external device via a cable, adaptor, or other type of electrical connector. In some embodiments, the communication port 1444 may be used to couple the electronic device 104 with a computing device and/or other appropriate accessories configured to send and/or receive electrical signals. The communication port 1444 may be configured to receive identifying information from an external accessory, which may be used to determine a mounting or support configuration. For example, the communication port 1444 may be used to determine that the electronic device 104 is coupled to a mounting accessory, such as a particular type of stand or support structure.

As shown in FIG. 14, the electronic device 104 may also include one or more input devices 1446. The input device 1446 may be or include the input region 116 (and associated elements) described herein. For example, the input device 1446 may be configured to receive an input that is used to control a function of the electronic device 104. Additionally, the input device 1446 may be one or more of a keyboard, mouse, pen, stylus, sound input device, touch input device, or the like.

Other examples and implementations are within the scope and spirit of the disclosure and appended claims. For example, features implementing functions may also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

The foregoing description, for purposes of explanation, uses specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure defining at least a portion of an inner volume and comprising:
   a translucent layer defining an input region; and
   an opaque masking layer positioned below the translucent layer and defining an array of microperforations, each of the array of microperforations having a width within a range of 30 microns to 80 microns;
   a light source positioned within the inner volume and configured to propagate light through the array of microperforations; and
   a sensing element positioned within the inner volume and configured to detect input received along the input region, wherein
   the array of microperforations are configured to display a symbol when illuminated by the light source.

2. The electronic device of claim 1, wherein:
   the translucent layer comprises a glass sheet;
   a first side the glass sheet forms an external surface of the enclosure; and
   the opaque masking layer is a layer of ink attached to a second side of the glass sheet that is opposite to the first side.

3. The electronic device of claim 1, wherein the array of microperforations collectively define at least one of:
an alpha-numeric character or a boundary of the input region.

4. The electronic device of claim 1, wherein a separation between each of the array of microperforations is within a range of 80 microns to 500 microns.

5. The electronic device of claim 1, wherein at least a subset of the array of microperforations is defined by tapered sidewalls extending through a thickness of the opaque masking layer.

6. The electronic device of claim 1, wherein at least a subset of the array of microperforations extend along an angle with respect to a surface along the input region to define a range of viewing angles of the symbol relative to the surface.

7. The electronic device of claim 1, wherein one or more of the array of microperforations is defined by a curved edge within the opaque masking layer.

8. The electronic device of claim 1, wherein the sensing element includes one or more of:
a tactile dome switch;
an electroactive polymer;
a piezoelectric structure;
a magnetic-based sensor;
a capacitance-based sensor; or
an optical sensor.

9. The electronic device of claim 1, wherein:
the enclosure includes a metal layer; and
the array of microperforations extend through the metal layer.

10. The electronic device of claim 1, wherein:
the input is a force input; and
a portion of the enclosure is configured to deform in response to the force input.

11. The electronic device of claim 1, wherein:
the enclosure defines a portion of a watch body having a first opening and a second opening;
the electronic device further comprises:
a display positioned within the first opening; and
a crown at least partially positioned within the second opening; and
a graphical output of the display is responsive to:
a rotation or translation of the crown; and
input received along the input region.

12. The electronic device of claim 1, wherein:
the enclosure defines a top surface and has a first opening and a second opening;
the input region is defined along the top surface;
the electronic device further comprises:
a display positioned within the first opening; and
a button positioned within the second opening; and
a graphical output of the display is responsive to:
a mechanical press of the button; and
input received within the input region.

13. The electronic device of claim 1, wherein:
the enclosure includes an upper portion pivotally coupled with a lower portion;
the upper portion defines an opening;
the lower portion includes the input region;
the electronic device further comprises a display positioned within the opening; and
the display is responsive to the input received within the input region.

14. The electronic device of claim 1, wherein:
the symbol is a first symbol;
the light source includes an array of selectively operable light elements configured to illuminate:
the first symbol using a first subset of the array of microperforations; and
a second symbol using a second subset of the array of microperforations, at least one microperforation of the array of microperforations belonging to both the first and second subsets; and
the sensing element is operative to:
trigger a first switch event in response to the detected force input when the first symbol is illuminated; and
trigger a second switch event in response to the detected force input when the second symbol is illuminated.

15. The electronic device of claim 14, wherein:
the electronic device further comprises a display; and
a graphical output of the display is modified:
in a first manner in response to the first switch event; and
in a second manner in response to the second switch event.

16. The electronic device of claim 14, wherein:
the first symbol defines a boundary of the input region;
the second symbol defines a modified boundary of the input region; and
the sensing element is responsive to:
input received within the boundary when the first symbol is displayed; and
input received within the modified boundary when the second symbol is displayed.

17. The electronic device of claim 1, wherein the sensing element is further configured to produce a tactile output along the input region in response to the detected input.

* * * * *